US012642132B2

(12) United States Patent
Guo et al.

(10) Patent No.: US 12,642,132 B2
(45) Date of Patent: May 26, 2026

(54) DIE STACKING PACKAGE ARCHITECTURE FOR HIGH-SPEED INPUT/OUTPUT WITH THROUGH-DIELECTRIC VIAS

(71) Applicant: Intel Corporation, Santa Clara, CA (US)

(72) Inventors: Jong-Ru Guo, Portland, OR (US); Zhen Zhou, Chandler, AZ (US); Jason Mix, Portland, OR (US); Chia-Pin Chiu, Tempe, AZ (US); Zuoguo Wu, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 77 days.

(21) Appl. No.: 17/742,799

(22) Filed: May 12, 2022

(65) Prior Publication Data
US 2023/0369289 A1    Nov. 16, 2023

(51) Int. Cl.
| | |
|---|---|
| *H01L 25/065* | (2023.01) |
| *H10W 70/65* | (2026.01) |
| *H10W 74/10* | (2026.01) |
| *H10W 90/00* | (2026.01) |
| *H10W 72/00* | (2026.01) |

(52) U.S. Cl.
CPC ........... *H10W 90/00* (2026.01); *H10W 70/65* (2026.01); *H10W 74/131* (2026.01); *H10W 90/701* (2026.01); *H10W 72/823* (2026.01); *H10W 90/752* (2026.01)

(58) Field of Classification Search
CPC ............. H01L 25/0657; H01L 23/3157; H01L 23/49811; H01L 25/50
See application file for complete search history.

(56) References Cited

U.S. PATENT DOCUMENTS

| | | | | |
|---|---|---|---|---|
| 10,833,052 | B2 * | 11/2020 | Shih ..................... | H01L 25/0655 |
| 11,310,907 | B2 * | 4/2022 | Dogiamis ............ | H05K 3/4038 |
| 2014/0175665 | A1 * | 6/2014 | Kang ................... | H01L 25/0655 |
| | | | | 257/774 |
| 2020/0286745 | A1 * | 9/2020 | Elsherbini ........... | H01L 21/4857 |
| 2021/0111156 | A1 * | 4/2021 | Elsherbini ............... | H01L 24/13 |
| 2024/0079339 | A1 * | 3/2024 | Marin ..................... | H01L 24/73 |
| 2025/0105209 | A1 * | 3/2025 | Duan ..................... | H01L 23/295 |
| 2025/0125307 | A1 * | 4/2025 | Ecton ..................... | H01L 24/16 |

* cited by examiner

*Primary Examiner* — Thao P Le
(74) *Attorney, Agent, or Firm* — Akona IP PC

(57) ABSTRACT

Embodiments of a microelectronic assembly comprise a package substrate, a first integrated circuit (IC) die, a second IC die between the first IC die and the package substrate, a dielectric material between the first IC die and the package substrate, and a plurality of vias through the dielectric material, the vias coupling the first IC die and the package substrate. The microelectronic assembly is in a space defined by three mutually orthogonal axes, a first axis, a second axis and a third axis; the package substrate, the first IC die and the second IC die are mutually parallel in first planes defined by the first axis and the third axis; the vias are in one or more second planes defined by the second axis and the third axis; and the vias are inclined at an angle not equal to ninety degrees around the first axis.

20 Claims, 11 Drawing Sheets

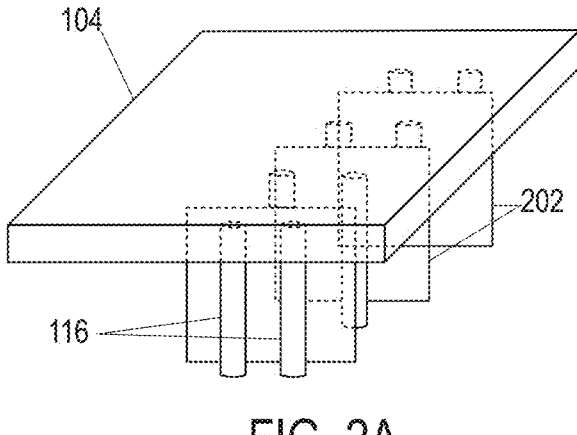
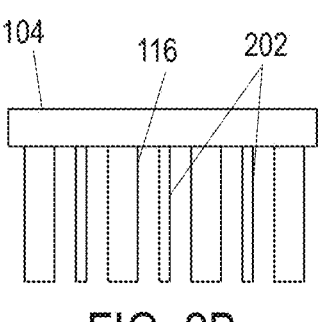
FIG. 2A
FIG. 2B
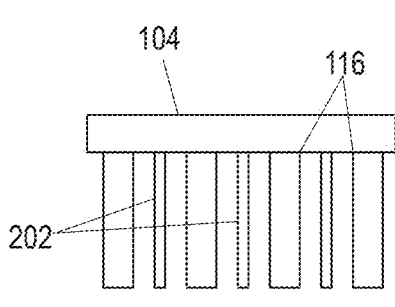
FIG. 3A
FIG. 3B

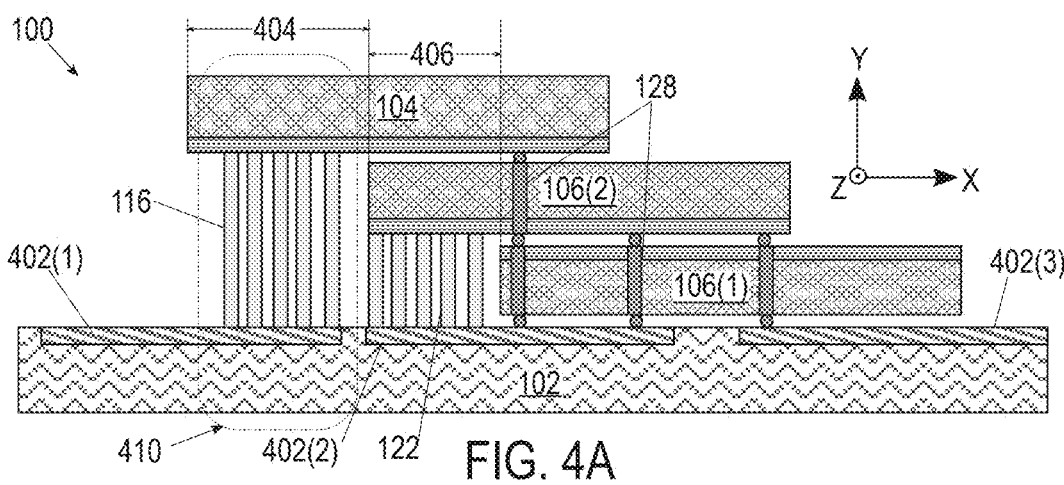
FIG. 4A
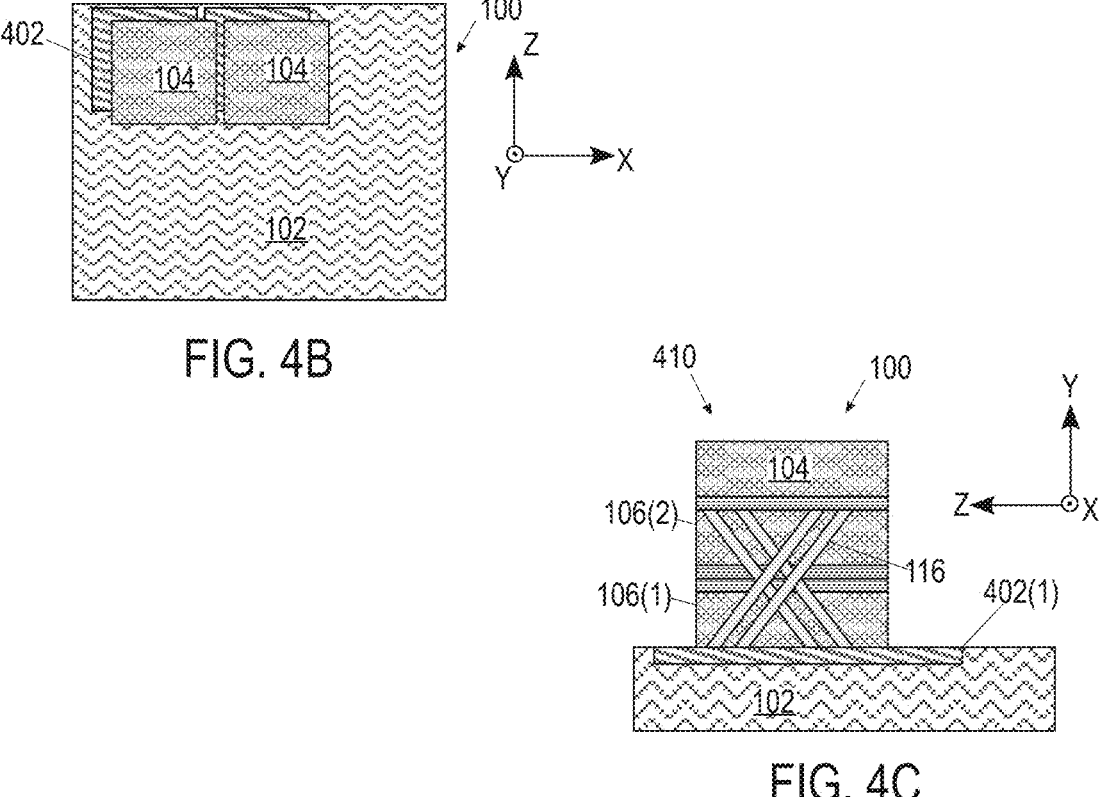
FIG. 4B
FIG. 4C

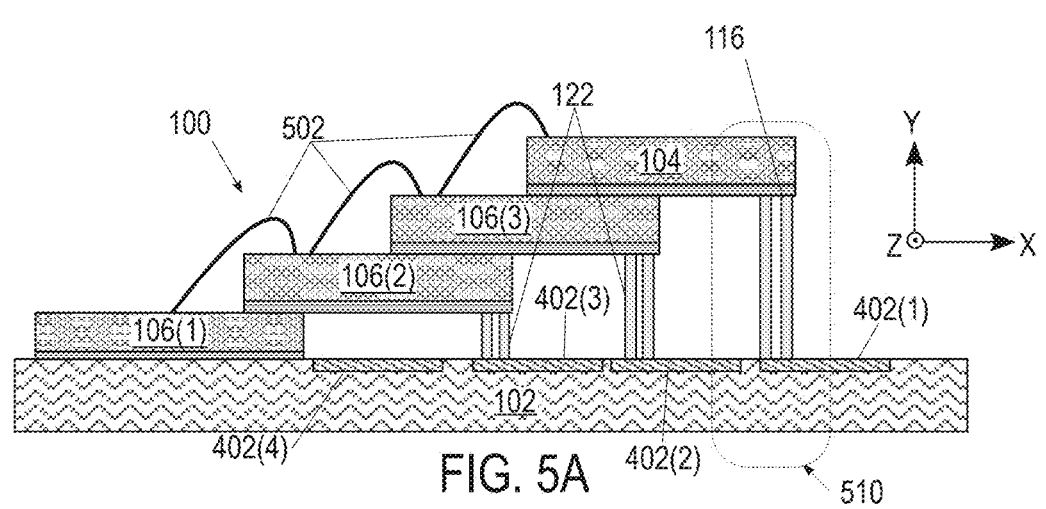
FIG. 5A
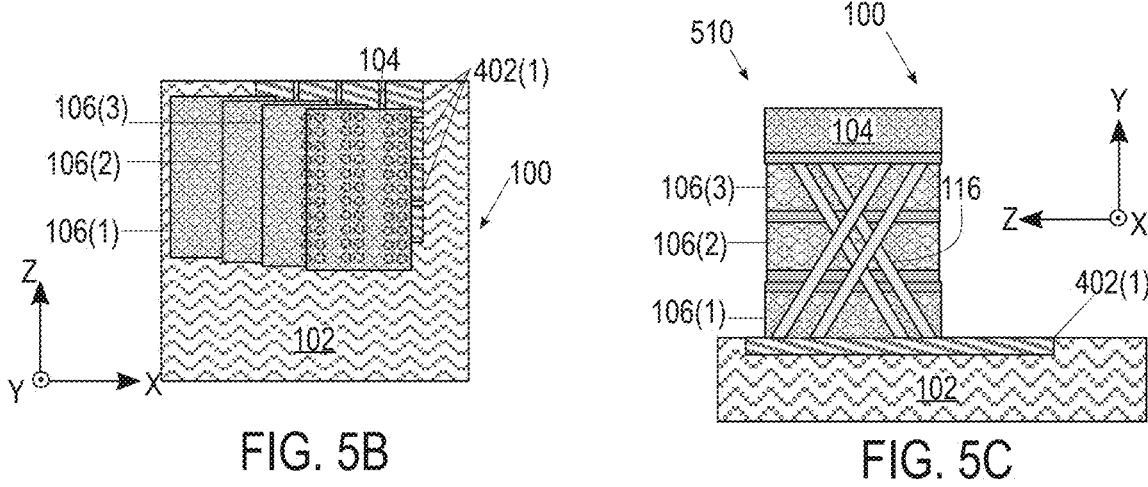
FIG. 5B
FIG. 5C
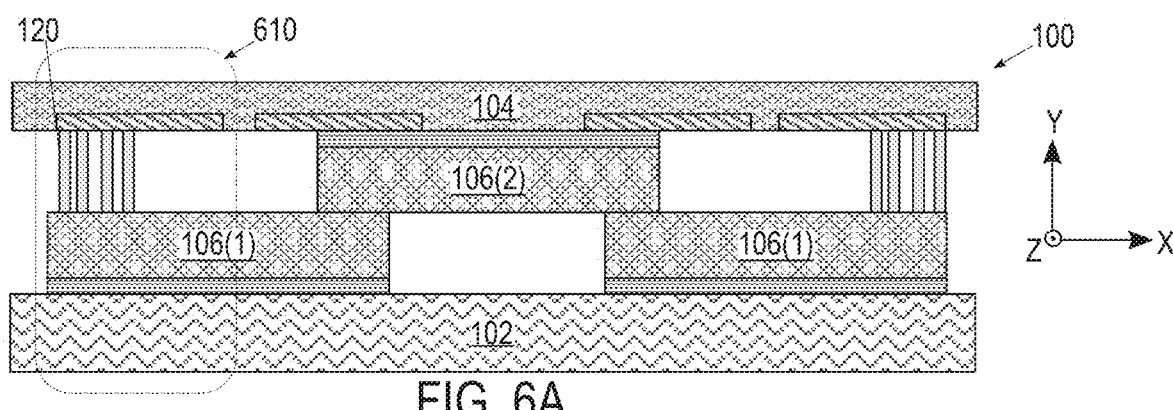
FIG. 6A

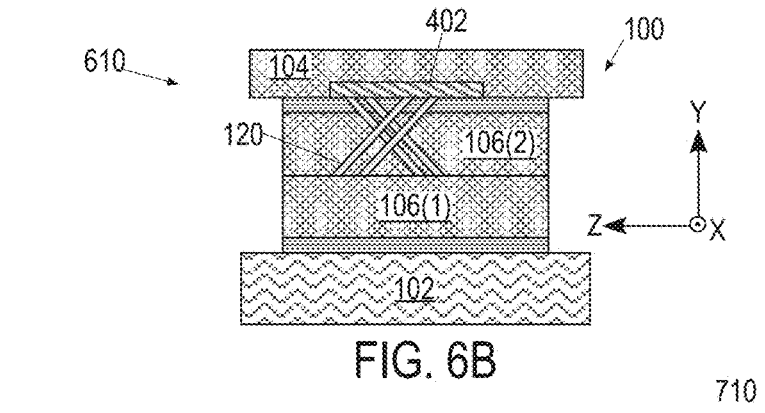
FIG. 6B
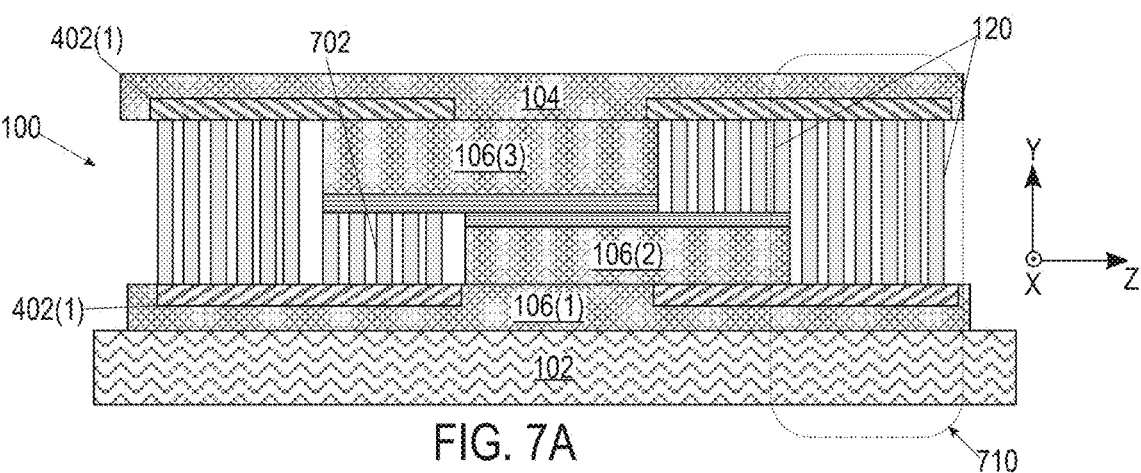
FIG. 7A
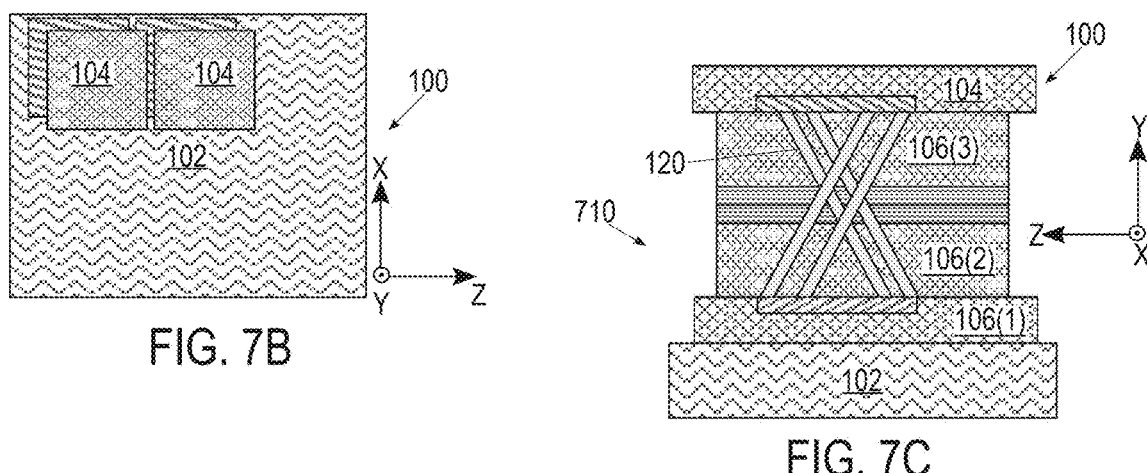
FIG. 7B
FIG. 7C

DIE STACKING PACKAGE ARCHITECTURE FOR HIGH-SPEED INPUT/OUTPUT WITH THROUGH-DIELECTRIC VIAS

TECHNICAL FIELD

The present disclosure relates to techniques, methods, and apparatus directed to die stacking package architecture for high-speed input/output with through-dielectric vias.

BACKGROUND

Electronic circuits when commonly fabricated on a wafer of semiconductor material, such as silicon, are called integrated circuits (ICs). The wafer with such ICs is typically cut into numerous individual dies. The dies may be packaged into an IC package containing one or more dies along with other electronic components such as resistors, capacitors, and inductors. The IC package may be integrated onto an electronic system, such as a consumer electronic system, or servers, such as mainframes.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 2A is a schematic isometric view of a portion of an example microelectronic assembly according to some embodiments of the present disclosure.

FIG. 2B is a schematic side view of the portion of FIG. 2A.

FIG. 3A is a schematic isometric view of a portion of another example microelectronic assembly according to some embodiments of the present disclosure.

FIG. 3B is a schematic side view of the portion of FIG. 3A.

FIG. 4A is a schematic cross-sectional view of yet another example microelectronic assembly according to some embodiments of the present disclosure.

FIG. 4B is a schematic top view of a portion of the microelectronic assembly of FIG. 4A.

FIG. 4C is another schematic cross-sectional view of a portion of the microelectronic assembly of FIG. 4A.

FIG. 5A is a schematic cross-sectional view of yet another example microelectronic assembly according to some embodiments of the present disclosure.

FIG. 5B is a schematic top view of a portion of the microelectronic assembly of FIG. 5A.

FIG. 5C is another schematic cross-sectional view of a portion of the microelectronic assembly of FIG. 5A.

FIG. 6A is a schematic cross-sectional view of yet another example microelectronic assembly according to some embodiments of the present disclosure.

FIG. 6B is another schematic cross-sectional view of a portion of the microelectronic assembly of FIG. 6A.

FIG. 7A is a schematic cross-sectional view of yet another example microelectronic assembly according to some embodiments of the present disclosure.

FIG. 7B is a schematic top view of a portion of the microelectronic assembly of FIG. 7A.

FIG. 7C is another schematic cross-sectional view of a portion of the microelectronic assembly of FIG. 7A.

DETAILED DESCRIPTION

Overview

Figure 1A:
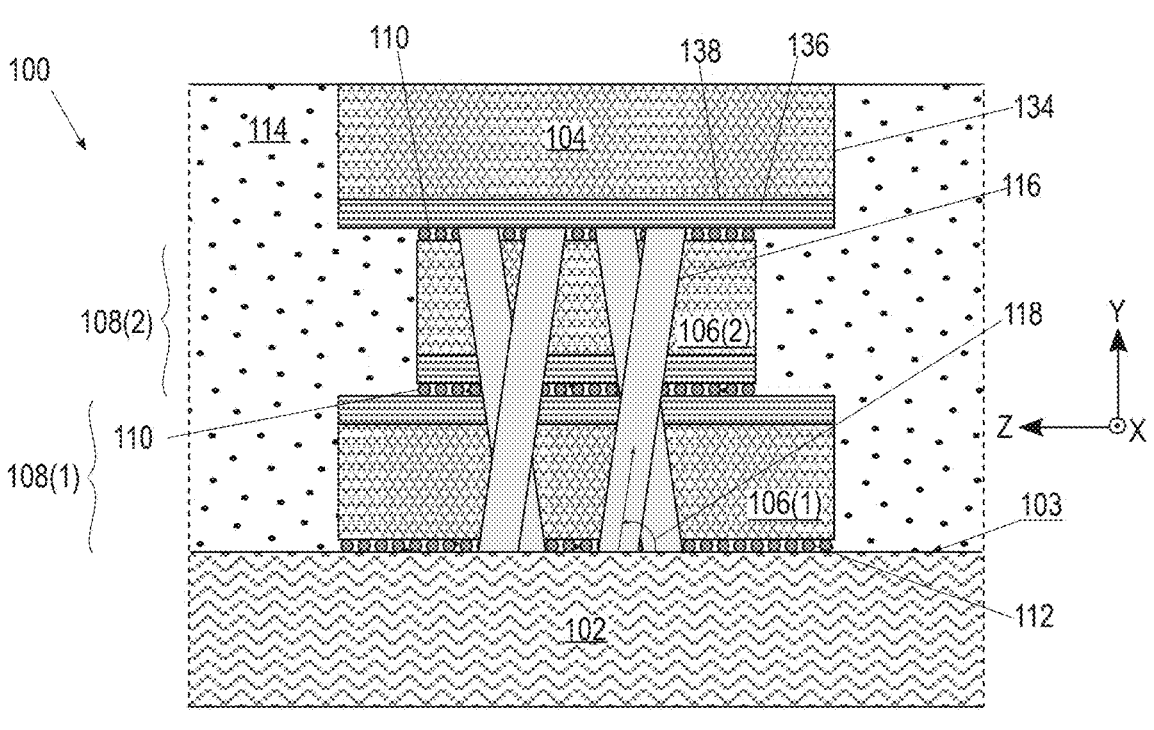
FIG. 1A is a schematic cross-sectional view of an example microelectronic assembly according to some embodiments of the present disclosure.

For purposes of illustrating IC packages described herein, it is important to understand phenomena that may come into play during assembly and packaging of ICs. The following foundational information may be viewed as a basis from which the present disclosure may be properly explained. Such information is offered for purposes of explanation only and, accordingly, should not be construed in any way to limit the broad scope of the present disclosure and its potential applications.

Many computing schemes such as artificial intelligence, machine learning and other emerging applications require more computing horsepower with higher performance, extremely low latency, and smaller form factors. Such demands foster the development of a 3-dimensional multi-chip package (3-D MCP) technology. Conventionally, 3-D MCP is achieved by utilizing Through Silicon Vias (TSV) to integrate IC dies serving different functionalities such as application specific integrated circuits (ASIC), radio-frequency (RF) circuits, and memory circuits in a single package, for example, to achieve higher aggregated data bandwidth, low latency, less interconnect loss, and hence less power consumption.

While TSVs offer a short interconnection among dies in a single MCP, it inherently experiences certain detriments such as reflection due to the impedance mismatch at the interfaces between two stacked dies. Moreover, multiple reflections can occur along such short vertical interconnect, which further amplify the impairments caused by the reflection. TSVs also suffer from crosstalk. Given that TSV is fabricated as vertical interconnect in silicon with a high dielectric constant, small diameter, and very confined pitch, the crosstalk, particularly near end crosstalk is expected to be high even when the interconnect length is relative short.

TSVs also have increased latency. Due to thin oxide liners in IC dies, the electrical field generated by the TSVs infringes on the performance of active devices in silicon, resulting in larger TSV capacitance, and hence a latency increase. Devices also suffer from lower resonant frequency from the presence of TSVs. Since the TSV capacitance is larger and it is an inductive vertical interconnect by nature, the resonant frequency of the TSV is usually low. The low resonant frequency limits the data rate of the die-to-die input/output speeds. Common practices to improve the performance of TSVs include employing more ground TSVs and properly arranging them, enlarging the pitches, and increasing TSV oxide liner thickness, etc.

However, TSVs lead to high fabrication cost due to high TSV counts, higher TSV redundancy, and hence higher maintenance costs. To support different IC die functions and IC die stacking structures, more complicated signal return paths are required, leading to optimization problems; simply increasing ground TSVs becomes less effective when signal counts increases beyond a certain extend. There is no effective and commonly known method to improve the resonant frequency of TSVs.

Accordingly, embodiments of the present disclosure provide a microelectronic assembly comprising: a package substrate, a first IC die, a second IC die between the first IC die and the package substrate, a dielectric material between the first IC die and the package substrate, and a plurality of vias through the dielectric material, the vias coupling the first IC die and the package substrate. The microelectronic assembly is in a space defined by three mutually orthogonal axes, a first axis, a second axis and a third axis; the package substrate, the first IC die and the second IC die are mutually parallel in first planes defined by the first axis and the third axis; the vias are in one or more second planes defined by the second axis and the third axis; and the vias are inclined at an angle not equal to ninety degrees around the first axis.

Embodiments of microelectronic assembly can provide interconnection structures that have less die-to-die interface, and hence less impedance discontinuity and less reflection. Such structures may also enable less latency due to less capacitive interconnection offered by the through-dielectric vias. Further, where the dielectric material is air, the through-dielectric vias may experience less crosstalk comparing to other dielectric materials. Embodiments of the microelectronic assembly as disclosed herein enable overall signal integrity improvement to support higher three-dimensional die-to-die input/output data rate.

Each of the structures, assemblies, packages, methods, devices, and systems of the present disclosure may have several innovative aspects, no single one of which is solely responsible for all the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art.

The terms "circuit" and "circuitry" mean one or more passive and/or active electrical and/or electronic components that are arranged to cooperate with one another to provide a desired function. The terms also refer to analog circuitry, digital circuitry, hard wired circuitry, programmable circuitry, microcontroller circuitry and/or any other type of physical hardware electrical and/or electronic component.

The term "integrated circuit" means a circuit that is integrated into a monolithic semiconductor or analogous material.

In some embodiments, the IC dies disclosed herein may comprise substantially monocrystalline semiconductors, such as silicon or germanium, as a base material (e.g., substrate, body) on which integrated circuits are fabricated with traditional semiconductor processing methods. The semiconductor base material may include, for example, N-type pr P-type materials. Dies may include, for example, a crystalline base material formed using a bulk silicon (or other bulk semiconductor material) or a silicon-on-insulator (SOI) structure. In some other embodiments, the base material of one or more of the IC dies may comprise alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-N, group III-V, group II-VI, or group IV materials. In yet other embodiments, the base material may comprise compound semiconductors, for example, with a first sub-lattice of at least one element from group III of the periodic table (e.g., Al, Ga, In), and a second sub-lattice of at least one element of group V of the periodic table (e.g., P, As, Sb). In yet other embodiments, the base material may comprise an intrinsic IV or III-V semiconductor material or alloy, not intentionally doped with any electrically active impurity; in alternate embodiments, nominal impurity dopant levels may be present. In still other embodiments, dies may comprise a non-crystalline material, such as polymers; for example, the base material may comprise silica-filled epoxy. In other embodiments, the base material may comprise high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the base material may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphide, and black phosphorus, each of which may possibly be doped with one or more of gallium, indium, aluminum, fluorine, boron, phosphorus, arsenic, nitrogen, tantalum, tungsten, and magnesium, etc. Although a few examples of the material for dies are described here, any material or structure that may serve as a foundation (e.g., base material) upon which IC circuits and structures as described herein may be built falls within the spirit and scope of the present disclosure.

Unless described otherwise, IC dies described herein include one or more IC structures (or, simply, "ICs") implementing (i.e., configured to perform) certain functionality. In one such example, the term "memory die" may be used to describe a die that includes one or more ICs implementing memory circuitry (e.g., ICs implementing one or more of memory devices, memory arrays, control logic configured to control the memory devices and arrays, etc.). In another such example, the term "compute die" may be used to describe a die that includes one or more ICs implementing logic/ compute circuitry (e.g., ICs implementing one or more of I/O functions, arithmetic operations, pipelining of data, etc.).

In another example, the terms "package" and "IC package" are synonymous, as are the terms "die" and "IC die." Note that the terms "chip," "die," and "IC die" are used interchangeably herein.

The term "insulating" means "electrically insulating," the term "conducting" means "electrically conducting," unless otherwise specified. With reference to optical signals and/or devices, components and elements that operate on or using optical signals, the term "conducting" can also mean "optically conducting."

The terms "oxide," "carbide," "nitride," etc. refer to compounds containing, respectively, oxygen, carbon, nitrogen, etc.

The term "high-k dielectric" refers to a material having a higher dielectric constant than silicon oxide, while the term "low-k dielectric" refers to a material having a lower dielectric constant than silicon oxide.

The term "insulating material" or "insulator" (also called herein as "dielectric material" or "dielectric") refers to solid materials (and/or liquid materials that solidify after processing as described herein) that are substantially electrically nonconducting. They may include, as examples and not as limitations, organic polymers and plastics, and inorganic materials such as ionic crystals, porcelain, glass, silicon, silicon oxide, silicon carbide, silicon carbonitride, silicon nitride, and alumina or a combination thereof. They may include dielectric materials, high polarizability materials, and/or piezoelectric materials. They may be transparent or opaque without departing from the scope of the present disclosure. Further examples of insulating materials are underfills and molds or mold-like materials used in packaging applications, including for example, materials used in organic interposers, package supports and other such components.

In various embodiments, elements associated with an IC may include, for example, transistors, diodes, power sources, resistors, capacitors, inductors, sensors, transceivers, receivers, antennas, etc. In various embodiments, elements associated with an IC may include those that are monolithically integrated within an IC, mounted on an IC, or those connected to an IC. The ICs described herein may be either analog or digital and may be used in a number of applications, such as microprocessors, optoelectronics, logic blocks, audio amplifiers, etc., depending on the components associated with the IC. The ICs described herein may be employed in a single IC die or as part of a chipset for executing one or more related functions in a computer.

In various embodiments of the present disclosure, transistors described herein may be field-effect transistors (FETs), e.g., MOSFETs. In general, a FET is a three-terminal device that includes source, drain, and gate terminals and uses electric field to control current flowing through the device. A FET typically includes a channel material, a source region and a drain regions provided in and/or over the channel material, and a gate stack that includes a gate electrode material, alternatively referred to as a "work function" material, provided over a portion of the channel material (the "channel portion") between the source and the drain regions, and optionally, also includes a gate dielectric material between the gate electrode material and the channel material.

In a general sense, an "interconnect" refers to any element that provides a physical connection between two other elements. For example, an electrical interconnect provides electrical connectivity between two electrical components, facilitating communication of electrical signals between them; an optical interconnect provides optical connectivity between two optical components, facilitating communication of optical signals between them. As used herein, both electrical interconnects and optical interconnects are comprised in the term "interconnect." The nature of the interconnect being described is to be understood herein with reference to the signal medium associated therewith. Thus, when used with reference to an electronic device, such as an IC that operates using electrical signals, the term "interconnect" describes any element formed of an electrically conductive material for providing electrical connectivity to one or more elements associated with the IC or/and between various such elements. In such cases, the term "interconnect" may refer to both conductive traces (also sometimes referred to as "lines," "wires," "metal lines" or "trenches") and conductive vias (also sometimes referred to as "vias" or "metal vias"). Sometimes, electrically conductive traces and vias may be referred to as "conductive traces" and "conductive vias", respectively, to highlight the fact that these elements include electrically conductive materials such as metals. Likewise, when used with reference to a device that operates on optical signals as well, such as a photonic IC (PIC), "interconnect" may also describe any element formed of a material that is optically conductive for providing optical connectivity to one or more elements associated with the PCI. In such cases, the term "interconnect" may refer to optical waveguides, including optical fiber, optical splitters, optical combiners, optical couplers, and optical vias.

The term "waveguide" refers to any structure that acts to guide the propagation of light from one location to another location typically through a substrate material such as silicon or glass. In various examples, waveguides can be formed from silicon, doped silicon, silicon nitride, glasses such as silica (e.g., silicon dioxide or $SiO_2$), borosilicate (e.g., 70-80 wt % $SiO_2$, 7-13 wt % of $B_2O_3$, 4-8 wt % $Na_2O$ or $K_2O$, and 2-8 wt % of $Al_2O_3$) and so forth. Waveguides may be formed using various techniques including but not limited to forming waveguides in situ. For example, in some embodiments, waveguides may be formed in situ in glass using low temperature glass-to-glass bonding or by laser direct writing. Waveguides formed in situ may have lower loss characteristics.

The term "conductive trace" may be used to describe an electrically conductive element isolated by an insulating material. Within IC dies, such insulating material comprises interlayer low-k dielectric that is provided within the IC die. Within package substrates, and printed circuit board (PCBs) such insulating material comprises organic materials such as Ajinomoto Buildup Film (ABF), polyimides, or epoxy resin. Such conductive lines are typically arranged in several levels, or several layers, of metallization stacks.

The term "conductive via" may be used to describe an electrically conductive element that interconnects two or more conductive lines of different levels of a metallization stack. To that end, a via may be provided substantially perpendicularly to the plane of an IC die/chip or a support structure over which an IC structure is provided and may interconnect two conductive lines in adjacent levels or two conductive lines in non-adjacent levels.

The term "package substrate" may be used to describe any substrate material that facilitates the packaging together of any collection of semiconductor dies and/or other electrical components such as passive electrical components. As used herein, a package substrate may be formed of any material including, but not limited to, insulating materials such as resin impregnated glass fibers (e.g., PCB or Printed Wiring Boards (PWB)), glass, ceramic, silicon, silicon carbide, etc. In addition, as used herein, a package substrate may refer to a substrate that includes buildup layers (e.g., ABF layers).

The term "metallization stack" may be used to refer to a stack of one or more interconnects for providing connectivity to different circuit components of an IC die/chip and/or a package substrate.

As used herein, the term "pitch" of interconnects refers to a center-to-center distance between adjacent interconnects.

In context of a stack of dies coupled to one another or in context of a die coupled to a package substate, the term "interconnect" may also refer to, respectively, die-to-die (DTD) interconnects and die-to-package substrate (DTPS) interconnects. DTD interconnects may also be referred to as first-level interconnects (FLI). DTPS interconnects may also be referred to as Second-Level Interconnects (SLI).

Although not specifically shown in all of the present illustrations in order to not clutter the drawings, when DTD or DTPS interconnects are described, a surface of a first die may include a first set of conductive contacts, and a surface of a second die or a package substrate may include a second set of conductive contacts. One or more conductive contacts of the first set may then be electrically and mechanically coupled to some of the conductive contacts of the second set by the DTD or DTPS interconnects.

In some embodiments, the pitch of the DTD interconnects may be different from the pitch of the DTPS interconnects, although, in other embodiments, these pitches may be substantially the same.

The DTPS interconnects disclosed herein may take any suitable form. In some embodiments, a set of DTPS interconnects may include solder (e.g., solder bumps or balls that are subject to a thermal reflow to form the DTPS interconnects). DTPS interconnects that include solder may include any appropriate solder material, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, a set of DTPS interconnects may include an anisotropic conductive material, such as an anisotropic conductive film or an anisotropic conductive paste. An anisotropic conductive material may include conductive materials dispersed in a non-conductive material. In some embodiments, an anisotropic conductive material may include microscopic conductive particles embedded in a binder or a thermoset adhesive film (e.g., a thermoset biphenyl-type epoxy resin, or an acrylic-based material). In some embodiments, the conductive particles may include a polymer and/or one or more metals (e.g., nickel or gold). For example, the conductive particles may include nickel-coated gold or silver-coated copper that is in turn coated with a polymer. In another example, the conductive particles may include nickel. When an anisotropic conductive material is uncompressed, there may be no conductive pathway from one side of the material to the other. However, when the anisotropic conductive material is adequately compressed (e.g., by conductive contacts on either side of the anisotropic conductive material), the conductive materials near the region of compression may contact each other so as to form a conductive pathway from one side of the film to the other in the region of compression.

The DTD interconnects disclosed herein may take any suitable form. In some embodiments, some or all of the DTD interconnects in a microelectronic assembly or an IC package as described herein may be metal-to-metal interconnects (e.g., copper-to-copper interconnects, or plated interconnects). In such embodiments, the conductive contacts on either side of the DTD interconnect may be bonded together (e.g., under elevated pressure and/or temperature) without the use of intervening solder or an anisotropic conductive material. In some metal-to-metal interconnects, a dielectric material (e.g., silicon oxide, silicon nitride, silicon carbide) may be present between the metals bonded together (e.g., between copper pads or posts that provide the associated conductive contacts). In some embodiments, one side of a DTD interconnect may include a metal pillar (e.g., a copper pillar), and the other side of the DTD interconnect may include a metal contact (e.g., a copper contact) recessed in a dielectric. In some embodiments, a metal-to-metal interconnect (e.g., a copper-to-copper interconnect) may include a noble metal (e.g., gold) or a metal whose oxides are conductive (e.g., silver). In some embodiments, a metal-to-metal interconnect may include metal nanostructures (e.g., nanorods) that may have a reduced melting point. Metal-to-metal interconnects may be capable of reliably conducting a higher current than other types of interconnects; for example, some solder interconnects may form brittle intermetallic compounds when current flows, and the maximum current provided through such interconnects may be constrained to mitigate mechanical failure.

In some embodiments, the dies on either side of a set of DTD interconnects may be bare (e.g., unpackaged) dies.

In some embodiments, the DTD interconnects may include solder. For example, the DTD interconnects may include conductive bumps or pillars (e.g., copper bumps or pillars) attached to the respective conductive contacts by solder. In some embodiments, a thin cap of solder may be used in a metal-to-metal interconnect to accommodate planarity, and this solder may become an intermetallic compound during processing. In some embodiments, the solder used in some or all of the DTD interconnects may have a higher melting point than the solder included in some or all of the DTPS interconnects. For example, when the DTD interconnects in an IC package are formed before the DTPS interconnects are formed, solder-based DTD interconnects may use a higher-temperature solder (e.g., with a melting point above 200 degrees Celsius), while the DTPS interconnects may use a lower-temperature solder (e.g., with a melting point below 200 degrees Celsius). In some embodiments, a higher-temperature solder may include tin; tin and gold; or tin, silver, and copper (e.g., 96.5% tin, 3% silver, and 0.5% copper). In some embodiments, a lower-temperature solder may include tin and bismuth (e.g., eutectic tin bismuth), tin, silver, bismuth, indium, indium and tin, or gallium.

In some embodiments, a set of DTD interconnects may include an anisotropic conductive material, such as any of the materials discussed above for the DTPS interconnects. In some embodiments, the DTD interconnects may be used as data transfer lanes, while the DTPS interconnects may be used for power and ground lines, among others.

In microelectronic assemblies or IC packages as described herein, some or all of the DTD interconnects may have a finer pitch than the DTPS interconnects. In some embodiments, the DTPS interconnects disclosed herein may have a pitch between about 80 microns and 300 microns, while the DTD interconnects disclosed herein may have a pitch between about 0.5 microns and 100 microns, depending on the type of the DTD interconnects. An example of silicon-level interconnect density is provided by the density of some DTD interconnects. In some embodiments, the DTD interconnects may have too fine a pitch to couple to the package substrate directly (e.g., too fine to serve as DTPS interconnects). The DTD interconnects may have a smaller pitch than the DTPS interconnects due to the greater similarity of materials in the different dies on either side of a set of DTD interconnects than between a die and a package substrate on either side of a set of DTPS interconnects. In particular, the differences in the material composition of dies and package substrates may result in differential expansion and contraction of the die dies and package substrates due to heat generated during operation (as well as the heat applied during various manufacturing operations). To mitigate damage caused by this differential expansion and contraction (e.g., cracking, solder bridging, etc.), the DTPS interconnects in any of the microelectronic assemblies or IC packages as described herein may be formed larger and farther apart than DTD interconnects, which may experience less thermal stress due to the greater material similarity of the pair of dies on either side of the DTD interconnects.

It will be recognized that one more levels of underfill (e.g., organic polymer material such as benzotriazole, imidazole, polyimide, or epoxy) may be provided in an IC package described herein and may not be labeled in order to avoid cluttering the drawings. In various embodiments, the levels of underfill may comprise the same or different insulating materials. In some embodiments, the levels of underfill may comprise thermoset epoxies with silicon oxide particles; in some embodiments, the levels of underfill may comprise any suitable material that can perform underfill functions such as supporting the dies and reducing thermal stress on interconnects. In some embodiments, the choice of underfill material may be based on design considerations, such as form factor, size, stress, operating conditions, etc.; in other embodiments, the choice of underfill material may be based on material properties and processing conditions, such as cure temperature, glass transition temperature, viscosity and chemical resistance, among other factors; in some embodiments, the choice of underfill material may be based on both design and processing considerations.

In some embodiments, one or more levels of solder resist (e.g., epoxy liquid, liquid photoimageable polymers, dry film photoimageable polymers, acrylics, solvents) may be provided in an IC package described herein and may not be labeled or shown to avoid cluttering the drawings. Solder resist may be a liquid or dry film material including photoimageable polymers. In some embodiments, solder resist may be non-photoimageable.

The terms "substantially," "close," "approximately," "near," and "about," generally refer to being within +/−20% of a target value (e.g., within +/−5% or 10% of a target value) based on the context of a particular value as described herein or as known in the art.

Terms indicating orientation of various elements, e.g., "coplanar," "perpendicular," "orthogonal," "parallel," or any other angle between the elements, generally refer to being within +/−5%-20% of a target value based on the context of a particular value as described herein or as known in the art.

The term "connected" means a direct connection (which may be one or more of a mechanical, electrical, and/or thermal connection) between the things that are connected, without any intermediary devices, while the term "coupled" means either a direct connection between the things that are connected, or an indirect connection through one or more passive or active intermediary devices.

The description uses the phrases "in an embodiment" or "in embodiments," which may each refer to one or more of the same or different embodiments.

Furthermore, the terms "comprising," "including," "having," and the like, as used with respect to embodiments of the present disclosure, are synonymous.

The disclosure may use perspective-based descriptions such as "above," "below," "top," "bottom," and "side"; such descriptions are used to facilitate the discussion and are not intended to restrict the application of disclosed embodiments.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers.

The term "dispose" as used herein refers to position, location, placement, and/or arrangement rather than to any particular method of formation.

The term "between," when used with reference to measurement ranges, is inclusive of the ends of the measurement ranges.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). When used herein, the notation "A/B/C" means (A), (B), and/or (C).

Although certain elements may be referred to in the singular herein, such elements may include multiple sub-elements. For example," an electrically conductive material" may include one or more electrically conductive materials. In another example, "a dielectric material" may include one or more dielectric materials.

Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

The accompanying drawings are not necessarily drawn to scale.

In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated. Further, the singular and plural forms of the labels may be used with reference numerals to denote a single one and multiple ones respectively of the same or analogous type, species, or class of element.

Furthermore, in the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using, e.g., images of suitable characterization tools such as scanning electron microscopy (SEM) images, transmission electron microscope (TEM) images, or non-contact profilometer. In such images of real structures, possible processing and/or surface defects could also be visible, e.g., surface roughness, curvature or profile deviation, pit or scratches, not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication and/or packaging.

Note that in the figures, various components (e.g., interconnects) are shown as aligned (e.g., at respective interfaces) merely for ease of illustration; in actuality, some or all of them may be misaligned. In addition, there may be other components, such as bond pads, landing pads, metallization, etc. present in the assembly that are not shown in the figures to prevent cluttering. Further, the figures are intended to show relative arrangements of the components within their assemblies, and, in general, such assemblies may include other components that are not illustrated (e.g., various interfacial layers or various other components related to optical functionality, electrical connectivity, or thermal mitigation). For example, in some further embodiments, the assembly as shown in the figures may include more dies along with other electrical components. Additionally, although some components of the assemblies are illustrated in the figures as being planar rectangles or formed of rectangular solids, this is simply for ease of illustration, and embodiments of these assemblies may be curved, rounded, or otherwise irregularly shaped as dictated by and sometimes inevitable due to the manufacturing processes used to fabricate various components.

In the drawings, a particular number and arrangement of structures and components are presented for illustrative purposes and any desired number or arrangement of such structures and components may be present in various embodiments.

Further, unless otherwise specified, the structures shown in the figures may take any suitable form or shape according to material properties, fabrication processes, and operating conditions.

Figure 10:
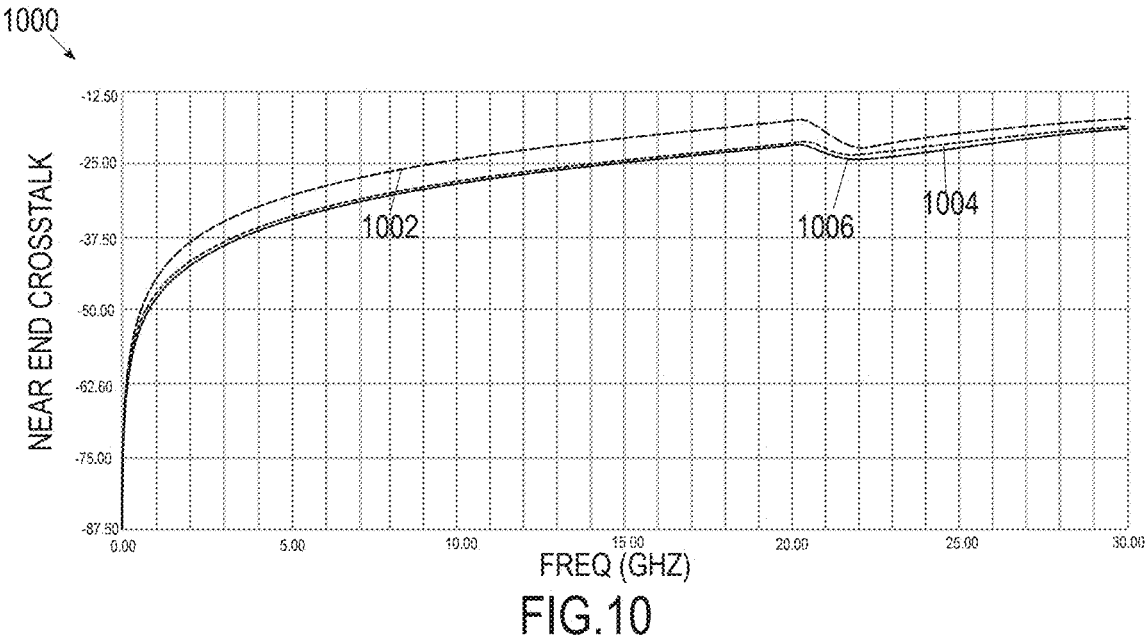
FIG. 10 is a graph of certain other results from example simulations of the microelectronic assembly according to some embodiments of the present disclosure.

For convenience, if a collection of drawings designated with different letters are present (e.g., FIGS. 10A-10C), such a collection may be referred to herein without the letters (e.g., as "FIG. 10"). Similarly, if a collection of reference numerals designated with different letters are present (e.g., 112a-112e), such a collection may be referred to herein without the letters (e.g., as "112").

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Example Embodiments

FIG. 1A is a schematic cross-sectional view of an example microelectronic assembly according to some embodiments of the present disclosure. Microelectronic assembly 100, which can be an IC package in some embodiments, comprises, in the embodiment shown, a package substrate 102, an IC die 104 and one or more IC dies 106 between IC die 104 and package substrate 102. In various embodiments, IC dies 106 may be arranged in a stack comprising a plurality of layers 108. For example, IC die 106(1) may be in layer 108(1); IC die 106(2) may be in layer 108(2); and so on. One or more layers 108 may comprise more than one IC die 106 in some embodiments. Each layer 108 in the stack of IC dies may be coupled to adjacent layers by FLIs 110. The stack of IC dies 106 may be coupled to package substrate 102 by SLIs 112.

A dielectric material 114 may envelop IC die 104 and IC dies 106, or in some embodiments, at least surround IC dies 106. Dielectric material 114 may be disposed between IC die 104 and package substrate 102 in some embodiments. In some embodiments, dielectric material 114 may be air (i.e., there is an air gap between the various IC dies 104, 106 and package substrate 102). In other embodiments, dielectric material 114 may comprise an organic dielectric, for example, mold compound, underfill material, or polyimides. Particular examples of such organic dielectric include epoxy polymer with appropriate fillers, polyester based thermoset epoxies with or without fillers, polyurethane-based mold compounds, silicone-based mold compounds, cyanoacrylates, acrylics, phenolic compounds, and unsaturated esters.

One or more vias 116 through dielectric material 114 may couple IC die 104 and package substrate 102. Microelectronic assembly is in a space defined by three mutually orthogonal axes, namely X-axis, Y-axis, and Z-axis, and for the sake of convenience and convention, they are defined as follows: the X-axis is along a length of microelectronic assembly 100, the Y-axis is along a thickness of microelectronic assembly 100, and the Z-axis is along a width of microelectronic assembly 100. Package substrate 102, IC die 104 and IC die 106 are mutually parallel in planes defined by the X-axis and the Z-axis, and vias 116 are in one or more planes defined by the Y-axis and the Z-axis. In various embodiments, vias 116 may be inclined at an angle 118 around the X-axis; in various embodiments, angle 118 is not equal to ninety degrees (i.e., angle 118 is an acute angle or an obtuse angle).

Figure 1B:
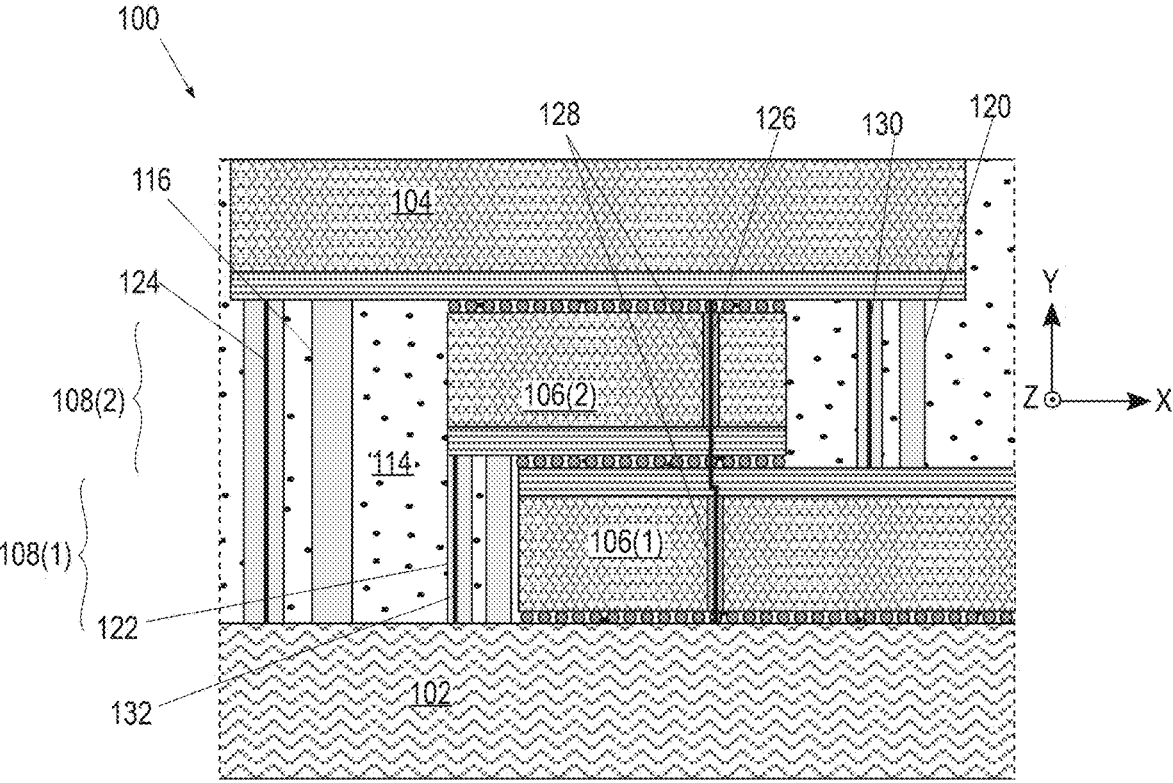
FIG. 1B is another schematic cross-sectional view of the example microelectronic assembly of FIG. 1A.

In various embodiments, vias 116 may be arranged in parallel rows (i.e., parallel along the planes defined by the Y-axis and the Z-axis), each row spaced apart from adjacent rows as shown more clearly in FIG. 1B. FIG. 1B is another schematic cross-sectional view of microelectronic assembly 100 shown from a different angle, namely looking along the X-axis. Within each row, vias 116 may be parallel to each other and inclined at angle 118 around the X-axis. Vias 116 in any particular row may be arranged at a different angle with respect to vias 116 in another row.

In various embodiments, one or more IC dies 106, for example, IC die 106(1) may not be adjacent to IC die 104. Such IC die 106(1) may be coupled to IC die 104 by one or more vias 120 through dielectric material 114. Vias 120 are in one or more planes defined by the Y-axis and the Z-axis, and in various embodiments, may be inclined at angle 118 around the X-axis. Angle 118 may be different for vias 120 as compared to vias 116. Vias 120 may be arranged in parallel rows (i.e., parallel along the planes defined by the Y-axis and the Z-axis), each row spaced apart from adjacent rows. Within each row, vias 120 may be parallel to each other and inclined at angle 118 around the X-axis. Vias 120 in any particular row may be arranged at a different angle with respect to vias 120 in another row.

One or more IC dies 106, for example, 106(2) may not be adjacent to package substrate 102. Such IC die 106(1) may be coupled to package substrate 102 by vias 122 through dielectric material 114. Vias 122 are in one or more planes defined by the Y-axis and the Z-axis, and in various embodiments, may be inclined at angle 118 around the X-axis. Angle 118 may be different for vias 122 as compared to vias 116 or vias 120. Vias 122 may be arranged in parallel rows (i.e., parallel along the planes defined by the Y-axis and the Z-axis), each row spaced apart from adjacent rows. Within each row, vias 122 may be parallel to each other and inclined at angle 118 around the X-axis. Vias 122 in any particular row may be arranged at a different angle with respect to vias 122 in another row.

In various embodiments, IC die 104 is conductively coupled to package substrate 102 by at least one of several conductive pathways. For example, conductive pathway 124 is through vias 116. Conductive pathway 126 is through one or more TSVs 128 in IC die 106. Conductive pathways 126 and/or 128 may pass through various FLIs 110 as appropriate. IC dies 106 may be coupled to IC die 104 and/or package substrate 102 by at least one of several conductive pathways. For example, IC die 106(1) may be coupled to IC die 104 by conductive pathway 130 through via 120 and/or conductive pathway 126 through IC die 106(2); IC die 106(2) may be coupled to package substrate 102 by conductive pathway 132 through via 122 and/or conductive pathway 126 through IC die 106(1).

Turning back to FIG. 1A, each one of IC dies 104 and 106 comprise a substrate 134, a metallization stack 136 and an active region 138 between substrate 134 and metallization stack 136. In some embodiments, metallization stack 136 of IC die 104 is adjacent to and in contact with metallization stack 136 of adjacent IC die 106 in a front-to-front configuration. In some embodiments, metallization stack 136 of IC die 104 is adjacent to and in contact with substrate 134 of adjacent IC die 106 in a front-to-back configuration. In some embodiments, substrate 134 of IC die 104 is adjacent to and in contact with substrate 134 of adjacent IC die 106 in a back-to-back configuration. In some embodiments, substrate 134 of IC die 104 is adjacent to and in contact with metallization stack 136 of adjacent IC die 106 in a back-to-front configuration. Likewise, IC dies 106 in the stack may be coupled to adjacent IC dies 106 by appropriate, front-to-front, front-to-back, back-to-front and back-to-back configurations according to particular needs. In some embodiments, a portion of IC dies 104 and/or 106 may comprise digital logic circuits (e.g., as used in compute dies, micro-processors, etc.), and another portion of IC dies 104 and/or 106 may comprise memory circuits (e.g., dynamic random-access memory (DRAM) circuits, cache-memory circuits, high-bandwidth memory (HBM) circuits, etc.). In various embodiments, IC die 104 may be larger than other IC dies 106 in microelectronic assembly 100 and may comprise more power consuming circuits, for example, to improve heat dissipation by directly attaching a heat sink (not shown) to IC die 104.

FIG. 2A is a schematic isometric view of a portion of an example microelectronic assembly 100 according to some embodiments of the present disclosure. Metal plates 202 may be provided between any two adjacent rows of vias 116, 120 and/or 122. At least some vias 116, 120 and/or 122 may be approximately 90 degrees around the X-axis in some embodiments. FIG. 2B is a schematic side view of the portion of FIG. 2A.

FIG. 3A is a schematic isometric view of a portion of another example microelectronic assembly 100 according to some embodiments of the present disclosure. The embodi-ment shown is similar to that of FIGS. 2A-2B, except that although rows of vias 116, 120 and/or 122 may be mutually parallel, as shown in FIG. 3B, at least some vias 116, 120 and/or 122 within any one row may not be mutually parallel. For example, among vias 116 shown, vias 116(2) are not parallel to vias 116(1).

FIG. 4A is a schematic cross-sectional view of yet another example microelectronic assembly 100 according to some embodiments of the present disclosure. In the example embodiment shown in the figure, microelectronic assembly 100 may comprise IC dies 106(1) and 106(2) in the stack of IC dies 106. IC die 106(1) may be adjacent to and coupled to package substrate 102. Package substrate 102 may com-prise one or more digital logic circuits 402 (e.g., 402(1), 402(2), etc.). In an example embodiment, package substrate 102 comprises a silicon interposer with active circuitry, and digital logic circuits 402 may comprise a portion of the active circuitry of the silicon interposer. In another example embodiment, digital logic circuits 402 may be fabricated separately and coupled to package substrate 102 by known means. In some embodiments, digital logic circuits 402 may comprise compute cores of a microprocessor and IC dies 104 and 106 may comprise memory circuits accessed by such compute cores.

IC dies 104 and 106 may be coupled according to an "overhang" or "stairway" architecture. IC die 104 overhangs beyond an edge of IC die 106(2) by an overhang region (e.g., 404) and IC die 106(2) overhangs beyond an edge of IC die 106(1) by another overhang region 406. A top view of a portion of microelectronic assembly 100 is shown in FIG. 4B. IC die 104 is coupled to one or more digital logic circuits 402, for example, 402(1) located in a shadow of overhang region 404 by at least a subset of vias 116. In various embodiments, such overlap in footprint of IC die 104 and digital logic circuits 402 may enable a compact package lateral size. IC die 104 may be conductively coupled to other ones of digital logic circuits 402, for example, 402(2) that are not located in the shadow of overhang region 404 by conductive pathways in TSVs 128 through IC dies 106(2) and 106(1).

IC die 106(2), which is not adjacent to package substrate 102, may be coupled to one or more digital logic circuits 402, for example, 402(2) located in a shadow of overhang region 406 by at least a subset of vias 122. IC die 106(2) may be conductively coupled to other ones of digital logic circuits 402, for example, 402(3) that are not located in the shadow of overhang region 406 by conductive pathways in TSVs 128 through IC die 106(1). As discussed in relation to FIG. 1, vias 116 and 122 are in one or more planes defined by the Y-axis and the Z-axis and are inclined at angle 118 around the X-axis, as shown by portion 410 in FIG. 4C, which is another schematic cross-sectional view of a portion of the microelectronic assembly of FIG. 4A, looking in the direction of the X-axis.

FIG. 5A is a schematic cross-sectional view of yet another example microelectronic assembly 100 according to some embodiments of the present disclosure. In the example embodiment shown in the figure, microelectronic assembly 100 may comprise IC dies 106(1), 106(2), and 106(3) in the stack of IC dies 106. IC die 106(1) may be adjacent to and coupled to package substrate 102. Package substrate 102 may comprise one or more digital logic circuits 402 (e.g., 402(1), 402(2), etc.). In an example embodiment, package substrate 102 comprises a silicon interposer with active circuitry, and digital logic circuits 402 may comprise a portion of the active circuitry of the silicon interposer.

IC dies 104 and 106 may be coupled according to an "overhang" or "stairway" architecture. Each IC die 106 in the stack may extend beyond an edge of at least one adjacent IC die 106 to which it is coupled. Vias 122 may conductively couple such overhanging regions to appropriate digital logic circuits 402 in package substrate 102 disposed in the respective shadows of the overhanging regions. IC die 104 may likewise overhang beyond an edge of IC die 106(3) to which it is coupled. Vias 116 may conductively couple the overhanging region to appropriate digital logic circuits 402 in package substrate 102 disposed in the shadow of the overhanging region.

Instead of (or in addition to) conductive coupling by TSVs 128, conductive coupling between adjacent IC dies 106 and/or IC die 104 may be by wire-bonds 502. For example, IC die 104 may be coupled to IC die 106(3) by wire-bond 502; IC die 106(3) may be coupled to IC die 106(2) by another wire-bond 502; and so on. IC die 106(1) may be coupled directly to package substrate 102 and may be coupled to one or more digital logic circuits 402, for example, 402 (4) by conductive pathways (not shown) within package substrate 102 as appropriate. In an example embodiment, wire-bonds 502 may be used to carry power and low-speed signals, whereas high-speed signals may be communicated through TSVs 128 (not shown) and vias 116, 122, etc., as appropriate.

FIG. 5B is a schematic top view of a portion of the microelectronic assembly of FIG. 5A, showing overlapping IC dies 106 and 104. Other details, such as wire-bond 502 are not shown for ease of illustration. FIG. 5C is another schematic cross-sectional view of a portion of the microelectronic assembly of FIG. 5A, looking in the direction of the X-axis. As discussed in relation to FIG. 1, vias 116 and 122 are in one or more planes defined by the Y-axis and the Z-axis and are inclined at angle 118 around the X-axis, as shown by portion 510 in FIG. 5C.

FIG. 6A is a schematic cross-sectional view of yet another example microelectronic assembly 100 according to some embodiments of the present disclosure. IC dies 104 and 106 may be arranged in a "tunneling" architecture. In such embodiments, IC die 104 may comprise circuits that consume more power than other circuits in microelectronic assembly 100. By placing such high-power consuming circuits on IC die 104, access to direct attachment of a heat sink is possible.

In various embodiments, IC die 104 may be provided with one or more digital logic circuits 402. IC dies 106 may be arranged in a stack in which each layer 108 may comprise more than one IC die 106. For example, layer 108(1) may comprise more than one IC die 106(1). IC die 106(2) in layer 108(2) may be coupled to more than one IC die 106(1). Note that other elements of microelectronic assembly 100, such as FLIs 110 and SLIs 112 are not shown in the figure merely for ease of illustration. Vias 120 may couple one or more digital logic circuits 402 in IC die 104 with one or more IC dies 106, for example, 106(1) in the example embodiment shown. As discussed in relation to FIG. 1, vias 120 are in one or more planes defined by the Y-axis and the Z-axis and are inclined at angle 118 around the X-axis, as shown by portion 610 in FIG. 6B, which is another schematic cross-sectional view of a portion of the microelectronic assembly of FIG. 6A, looking in the direction of the X-axis.

FIG. 7A is a schematic cross-sectional view of yet another example microelectronic assembly 100 according to some embodiments of the present disclosure. IC dies 104 and 106 may be arranged in a "hybrid" architecture involving features of "overhang" or "stairway" architecture and "tunneling" architecture. IC die 104 may be provisioned with a first plurality of digital logic circuits 402(1), and one or more of IC dies 106, for example, 106(1), may be provisioned with a second plurality of digital logic circuits 402(2). Some IC dies 106, for example, 106(3) may overhang beyond an edge of adjacent IC dies 106, for example, 106(2), and may be coupled to yet other IC dies 106, for example, 106(1) by vias 702 through dielectric material 114 (not shown). In various embodiments, vias 120 couple first plurality of digital logic circuits 402(1) with second plurality of digital logic circuits 402(2). Vias 702 couple IC die 106(3) with digital logic circuits 402(2) in IC die 106(1). Vias 702, like vias 120, are in one or more planes defined by the Y-axis and the Z-axis, and inclined at an angle around the X-axis, as shown in portion 710 of FIG. 7C which is another schematic cross-sectional view of a portion of the microelectronic assembly of FIG. 7A, looking in the direction of the X-axis. FIG. 7B is a schematic top view of a portion of the microelectronic assembly of FIG. 7A, showing overlapping IC dies 106 and 104. In some embodiments, first plurality of digital logic circuits 402(1) may consume higher power during operation than second plurality of digital logic circuits 402(2). In such embodiments, a heat sink (not shown) may be coupled to IC die 104 appropriately for heat dissipation.

Figures 8, 9:
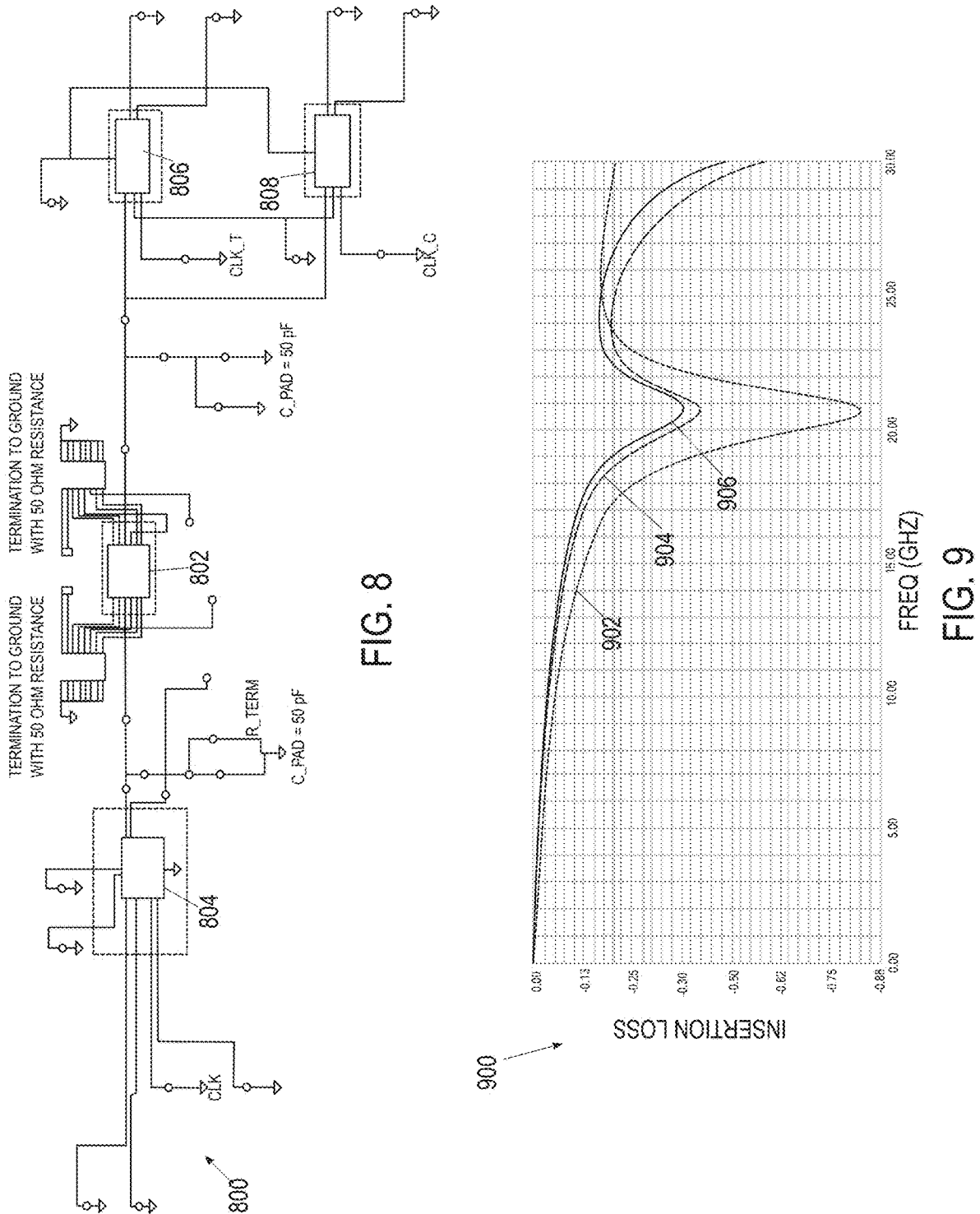
FIG. 8 is a schematic circuit diagram of an example simulation test setup of the microelectronic assembly according to various embodiments of the present disclosure.
FIG. 9 is a graph of certain results from example simulations of the microelectronic assembly according to some embodiments of the present disclosure.

FIG. 8 is a schematic circuit diagram of an example simulation test setup 800 of microelectronic assembly 100 according to various embodiments of the present disclosure. Microelectronic assembly with various configurations of vias 116 (or 120, 122, 702, etc.) may be simulated by device block 802. A stimulus is provided by stimulus block 804, and responses at ends of respective vias 116 (or 120, 122, 702, etc.) may be read at receiver blocks 806 and 808. In some embodiments, receiver block 806 may read a worst-case response, and receiver block 808 may read a best-case response. Stimulus block 804 may generate a transmission signal (e.g., with a Vdd voltage of 0.5V), with a transmission side resistor and capacitor. Device block 802 may have separate channels for separate design configurations. Receiver side resistor and capacitor may be provided appropriately in test setup 800. In an example simulation, receiver blocks 806 and 808 have half-rate architecture for sampling.

In an example simulation run, simulation test setup 800 used a three-dimensional model for electromagnetic field analysis. Three design configurations were considered in the model including: (1) TSVs (e.g., 128); (2) through-dielectric vias (e.g., 116, 120, 122, 702); and (3) through-dielectric vias (e.g., 116, 120, 122, 702) with metal plates (e.g., 202) for isolation. The total length of each TSV was 135 micrometers, pitch was 100 micrometers, diameter was 20 micrometesr and signal to ground ratio was 2:1. The dielectric constant for dielectric material 114 was assumed to be 2.02. The total length of each via was 135 micrometers, pitch was 100 micrometers, diameter was 40 micrometers and signal to ground ratio was 2:1 in the configuration with the metal plate and without the metal plate. Simulations were also run comparing straight vias with slanted vias inclined at angle 118 around the X-axis. Note that the dimensional and other values provided here are merely example values used in a specific simulation run; other dimensional and other values of the various elements may be used in various embodiments of microelectronic assembly 100 without departing from the scope of the present disclosure.

For the various design configurations simulated, the highest achievable data rates and their corresponding performance metrics such as eye width, eye height, far end crosstalk, insertion loss, near end crosstalk were monitored. S-parameters were extracted and compared for the three design configurations. It was observed that the through-dielectric vias with the metal plates outperformed the other two configurations in insertion loss, near end crosstalk, and far end crosstalk. The simulations also showed that the through-dielectric vias with metal plates supported a higher data rate of 52 Gbps as compared to the TSV, which supported data rates close to 48 Gbps and the through-dielectric vias (without metal plates) that supported data rates up to 48 Gbps. Further, the slanted vias outperformed the straight vias in signal integrity based on the simulations. For example, the far end crosstalk of the slanted via showed that its corner frequency was higher compared to the straight via with lower far end crosstalk value at frequency less than 13.5 GHz. Likewise, comparison of return loss between the two types of vias showed that the slanted vias had 2.5 dB loss improvement compared to the straight vias.

FIG. 9 is a graph of insertion loss responses from example simulations of test setup 800 of microelectronic assembly 100 according to some embodiments of the present disclosure. Line 902 corresponds to the insertion loss as a function of frequency of the design configuration with TSVs; line 904 corresponds to the insertion loss as a function of frequency of the design configuration with through-dielectric vias (without metal plates); and line 906 corresponds to the insertion loss as a function of frequency of the design configuration with through-dielectric vias (with metal plates). For example, the maximum insertion loss for the design configuration with TSVs was −0.82 dB at a resonant frequency of around 21.14 GHz as shown by line 902; the maximum insertion loss for the design configuration with through-dielectric vias (without metal plates) was −0.42 dB at the resonant frequency as shown by line 904; and the maximum insertion loss for the design configuration with through-dielectric vias (with metal plates) was −0.22 dB at the resonant frequency as shown by line 906. Note that the responses will vary according to simulation conditions; the values noted here are merely for the particular simulation conditions described in reference to FIG. 8.

FIG. 10 is a graph of worst-case near end crosstalk responses from example simulations of test setup 800 of microelectronic assembly 100 according to some embodiments of the present disclosure. Line 1002 corresponds to the worst-case near end crosstalk as a function of frequency of the design configuration with TSVs; line 1004 corresponds to the worst-case near end crosstalk as a function of frequency of the design configuration with through-dielectric vias (without metal plates); and line 1006 corresponds to the worst-case near end crosstalk as a function of frequency of the design configuration with through-dielectric vias (with metal plates). For example, the maximum worst-case near end crosstalk was for the design configuration with TSVs as shown by line 1002, as suggested by the following responses: at a frequency of 20.27 GHZ, the design configuration with TSVs had a near end crosstalk of −17.26 dB; the design configuration with through-dielectric vias (without metal plates) had a near end crosstalk of −21.4 dB; the design configuration with through-dielectric vias (with metal plates) had a near end crosstalk of −23.72 dB. Note that the responses will vary according to simulation conditions; the values noted here are merely for the particular simulation conditions described in reference to FIG. 8.

Figure 11:
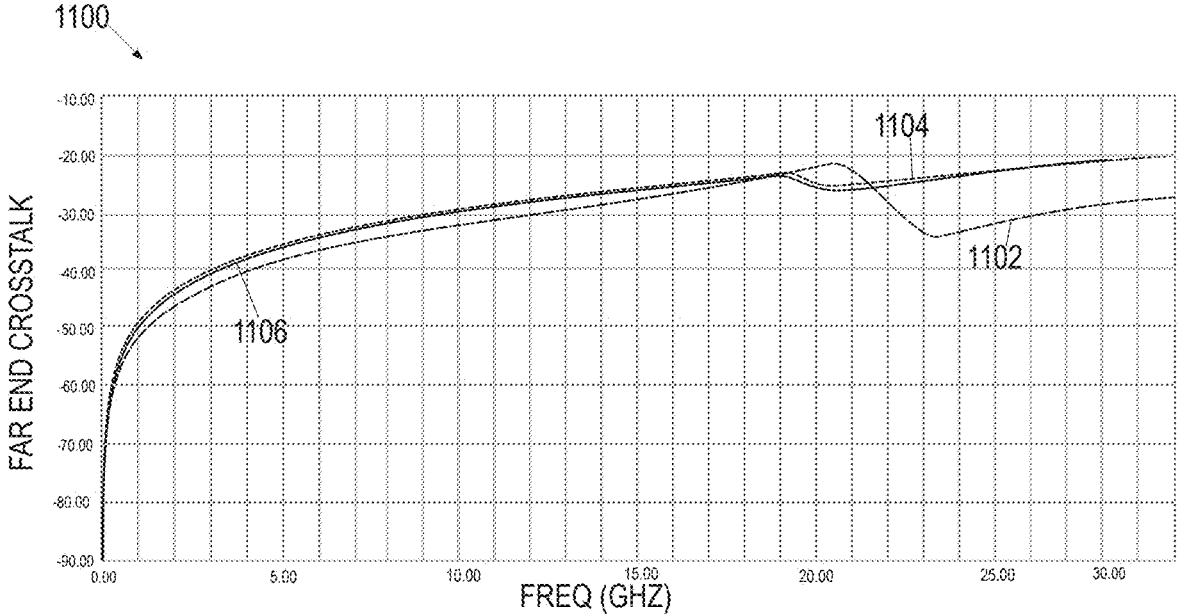
FIG. 11 is a graph of yet other results from example simulations of the microelectronic assembly according to some embodiments of the present disclosure.

FIG. 11 is a graph of worst-case far end crosstalk responses from example simulations of test setup 800 of microelectronic assembly 100 according to some embodiments of the present disclosure. Line 1102 corresponds to the worst-case far end crosstalk as a function of frequency of the design configuration with TSVs; line 1104 corresponds to the worst-case far end crosstalk as a function of frequency of the design configuration with through-dielectric vias (without metal plates); and line 1106 corresponds to the worst-case far end crosstalk as a function of frequency of the design configuration with through-dielectric vias (with metal plates). For example, the maximum worst-case far end crosstalk was for the design configuration with TSVs as shown by line 1102, as suggested by the following responses: at a frequency of 20.54 GHZ, the design configuration with TSVs had a far end crosstalk of −21.29 dB; the design configuration with through-dielectric vias (without metal plates) had a far end crosstalk of −23 dB; the design configuration with through-dielectric vias (with metal plates) had a far end crosstalk of −25.21 dB. Note that the responses will vary according to simulation conditions; the values noted here are merely for the particular simulation conditions described in reference to FIG. 8.

In various embodiments, any of the features discussed with reference to any of FIGS. 1-11 herein may be combined with any other features to form an IC package with one or more IC dies as described herein, for example, to form a modified microelectronic assembly 100. Further, although some embodiments in the figures do not include metal plates 202 between rows of vias 116, 120, 122 or 702, such metal plates 202 may be included between rows of vias 116, 120, 122 or 702 without departing from the scope of the present disclosure. Some such combinations are described above, but, in various embodiments, further combinations and modifications are possible.

Example Methods

Figures 12A, 12B, 12C, 12D, 12E, 12F, 12G, 12H:
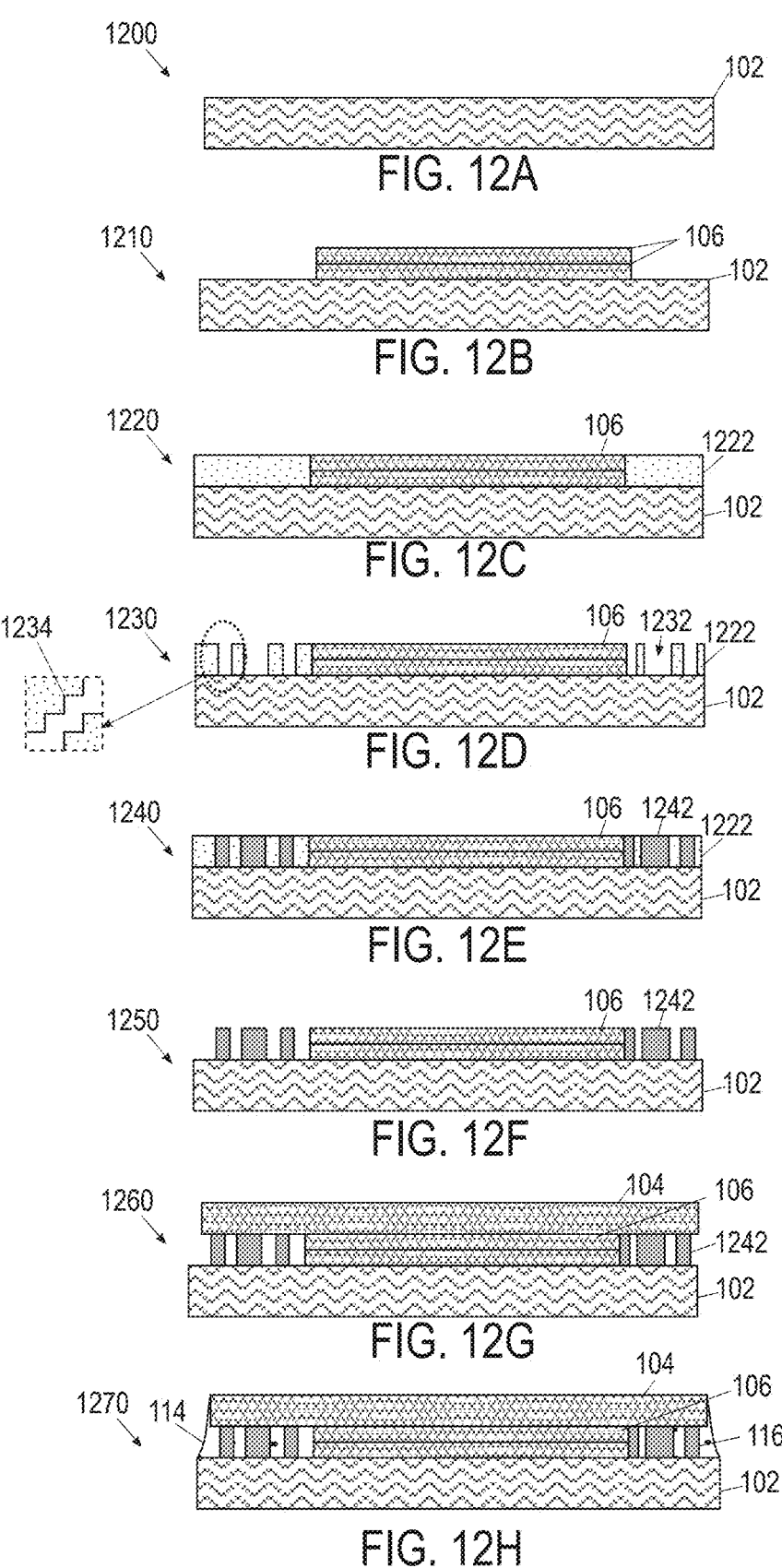
FIGS. 12A-12H are schematic cross-sectional view of various stages of manufacture of an example microelectronic assembly according to some embodiments of the present disclosure.

FIGS. 12A-12H are schematic cross-sectional view of various stages of manufacture of an example microelectronic assembly according to some embodiments of the present disclosure. FIG. 12A shows a package substrate 102 on which microelectronic assembly 100 will be fabricated. FIG. 12B shows an assembly 1210 subsequent to attaching a stack of IC dies 106 to package substrate 102. Attachment may be by SLIs 112, and corresponding processes, such as solder reflow. FIG. 12C shows an assembly 1220 subsequent to coating assembly 1210 with a photoresist 1222.

FIG. 12D shows an assembly 1230 subsequent to removing photoresist 1222 corresponding to at least one of through-dielectric vias 116 (or 120, 122, 702, etc. as appropriate) and/or metal plates 202 and opening through-holes 1232. In an example embodiment, removing the photoresist comprises using a laser to remove the photoresist. For example, the laser is moved across photoresist 1222 in a first direction in a first pass to form a row of through-holes 1232 having a first angle 118. In the next step, the laser is moved orthogonally to the first direction by a distance corresponding to a spacing between adjacent rows of vias. In the next step, the laser is moved across photoresist 1222 in a second direction in a second pass to form another row of through-holes 1232 having a second angle, the second angle being opposite in direction to the first angle. In another embodiment, instead of a laser, coating with photoresist 1222 and removing photoresist 1222 are repeated multiple times with overlapping and adjacent via locations to create through-holes 1232 with a stepped, slanted profile 1234 as shown in the inset.

FIG. 12E shows an assembly 1240 subsequent to depositing metal 1242 in through-holes 1232. In an example embodiment, metal 1242 may be deposited by electroplating using known methods in the art. FIG. 12F shows an assembly 1250 subsequent to removing photoresist 1222. FIG. 12G shows an assembly 1260 subsequent to attaching IC die 104 to the stack of IC dies 106 such that a portion of IC die 104 overhangs beyond an edge of IC dies 106 to contact deposited metal 1242. In various embodiments, attaching IC die 104 comprises forming FLIs 110 between IC die 104 and the stack of IC dies 106. FIG. 12H shows an assembly 1270 subsequent to dispensing dielectric material 114 around the stack of IC dies 106 and IC die 104, and curing dielectric material 114 (in those embodiments where dielectric material 114 is an organic dielectric material), completing the structure of through-dielectric vias 116. In various embodiments, coating the photoresist, removing the photoresist, depositing metal, and attaching another IC die may be repeated as desired until a multi-layered stack of IC dies is formed according to a desired configuration, with the through-dielectric vias between any two IC dies, and between any IC die and the package substrate as described in connection with the preceding figures.

Although FIG. 12 illustrates various operations performed in a particular order, this is simply illustrative, and the operations discussed herein may be reordered and/or repeated as suitable. Further, additional processes which are not illustrated may also be performed without departing from the scope of the present disclosure. Also, various ones of the operations discussed herein with respect to FIG. 12 may be modified in accordance with the present disclosure to fabricate others of microelectronic package 100 disclosed herein. Although the operations are illustrated in FIG. 12 once each, the operations may be repeated as often as desired. For example, one or more operations may be performed in parallel to manufacture multiple microelectronic packages substantially simultaneously. In another example, the operations may be performed in a different order to reflect the structure of a particular microelectronic package 100 as described herein.

Furthermore, the operations illustrated in FIG. 12 may be combined or may include more details than described. Still further, the operations as described may further include other manufacturing operations related to fabrication of other components of the microelectronic assemblies described herein, or any devices that may include the microelectronic assemblies as described herein. For example, the operations may include various cleaning operations, surface planarization operations (e.g., using chemical mechanical polishing (CMP)), operations for surface roughening, operations to include barrier and/or adhesion layers as desired, and/or operations (e.g., solder reflow, epoxy curing, etc.) for incorporating microelectronic packages as described herein in, or with, an IC component, a computing device, or any desired structure or device.

Example Devices and Components

Figure 13:
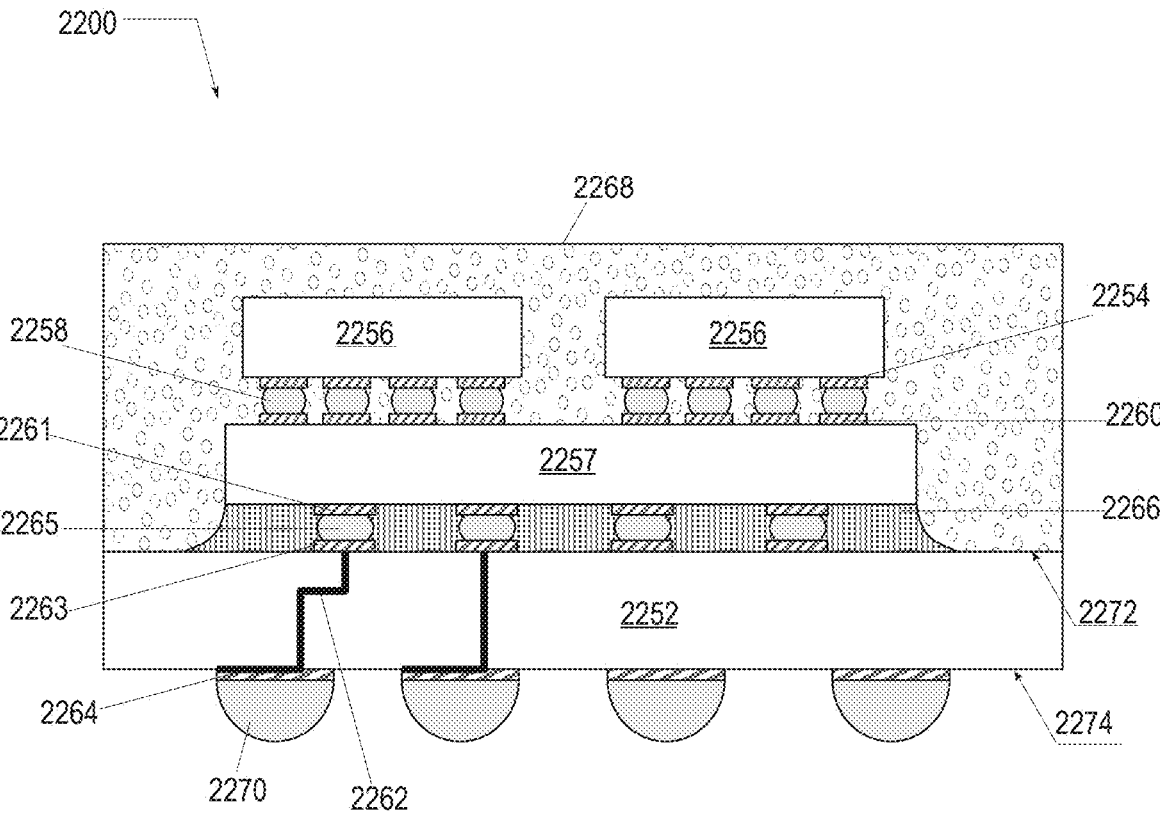
FIG. 13 is a cross-sectional view of a device package that includes one or more microelectronic assemblies in accordance with any of the embodiments disclosed herein.
Figure 14:
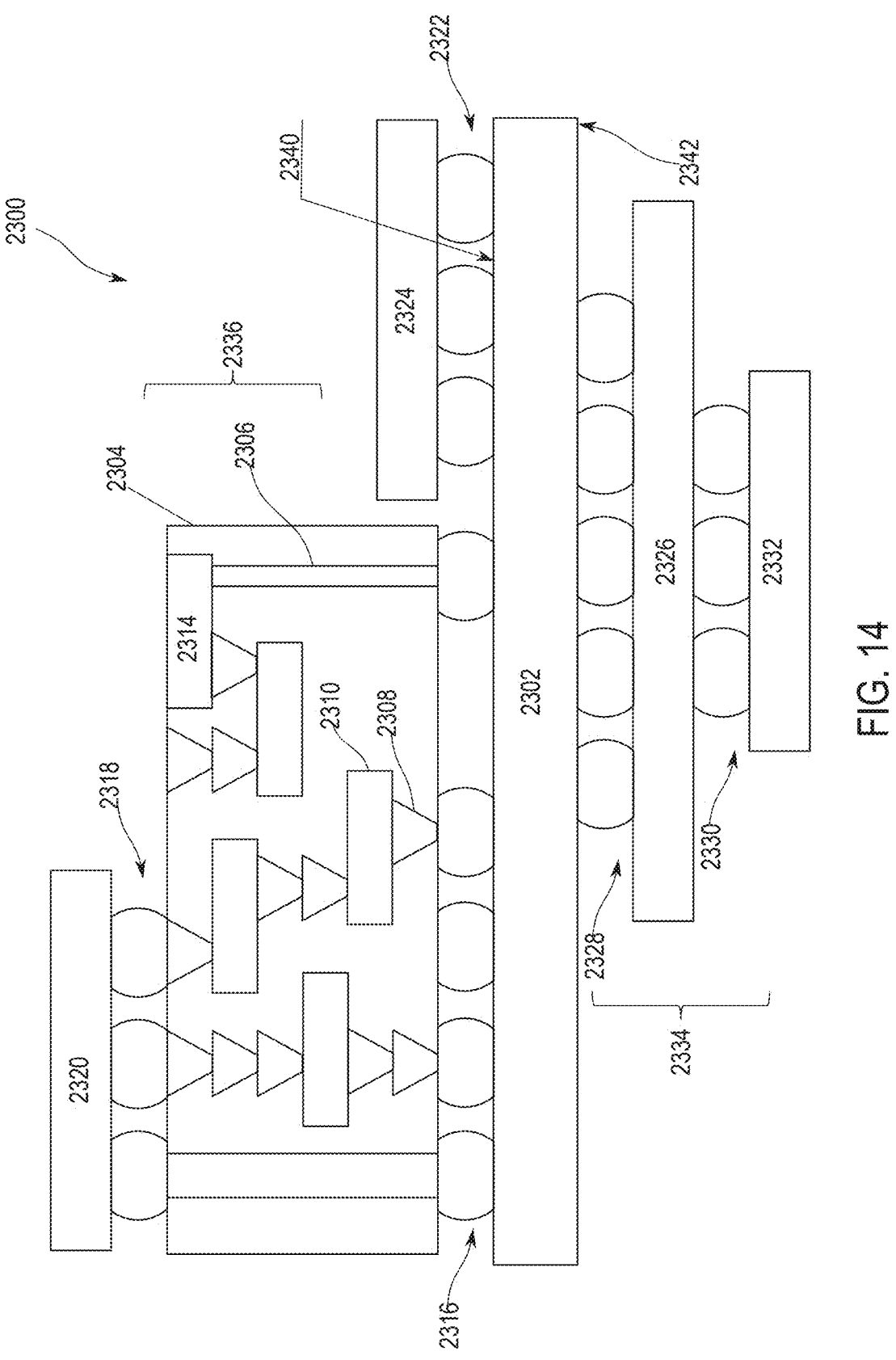
FIG. 14 is a cross-sectional side view of a device assembly that includes one or more microelectronic assemblies in accordance with any of the embodiments disclosed herein.
Figure 15:
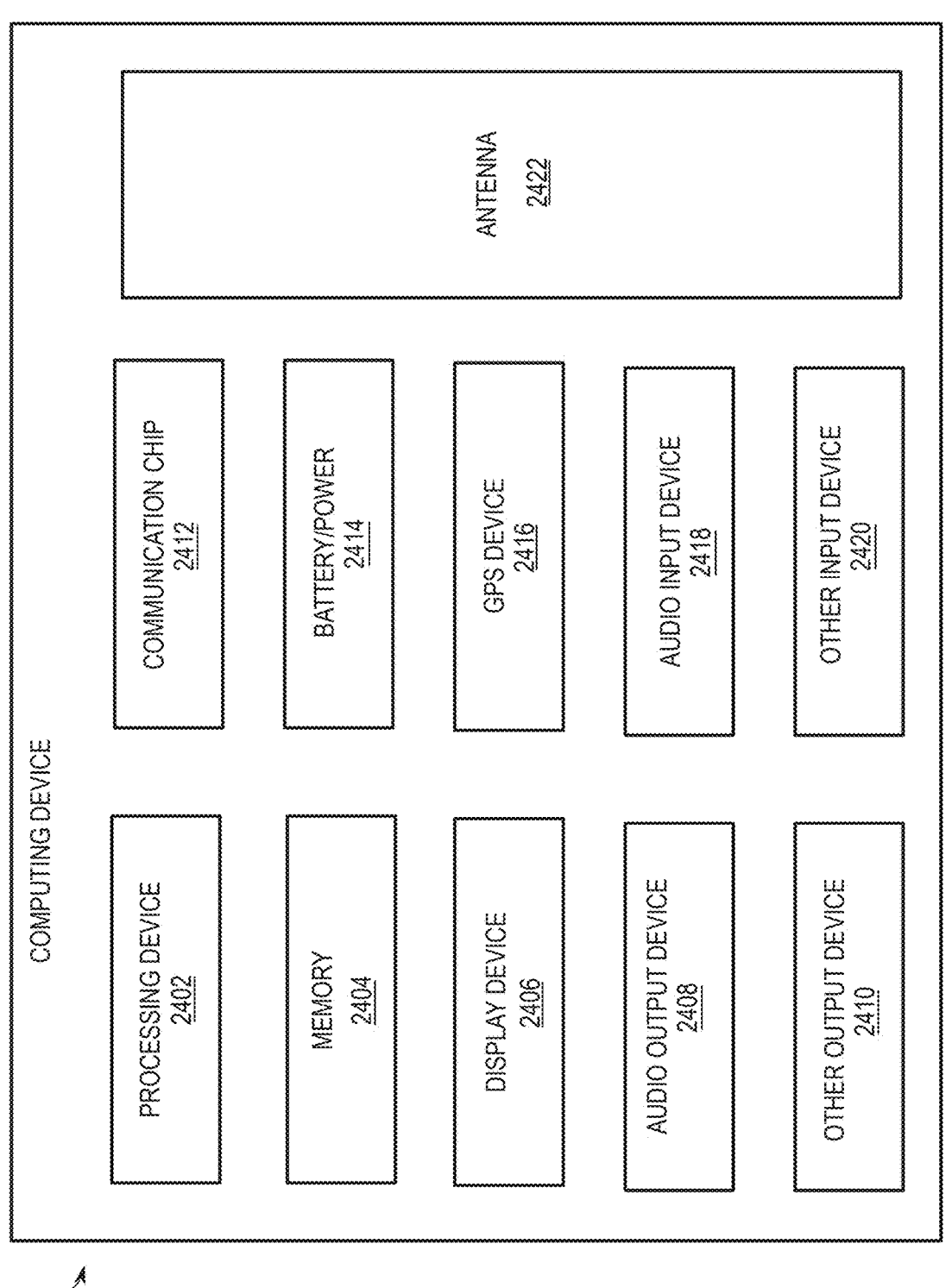
FIG. 15 is a block diagram of an example computing device that includes one or more microelectronic assemblies in accordance with any of the embodiments disclosed herein.

The packages disclosed herein, e.g., any of the embodiments shown in FIGS. 1-12 or any further embodiments described herein, may be included in any suitable electronic component. FIGS. 13-15 illustrate various examples of packages, assemblies, and devices that may be used with or include any of the IC packages as disclosed herein.

FIG. 13 is a side, cross-sectional view of an example IC package 2200 that may include IC packages in accordance with any of the embodiments disclosed herein. In some embodiments, the IC package 2200 may be a SiP.

As shown in the figure, package substrate 2252 may be formed of an insulator (e.g., a ceramic, a buildup film, an epoxy film having filler particles therein, etc.), and may have conductive pathways extending through the insulator between first face 2272 and second face 2274, or between different locations on first face 2272, and/or between different locations on second face 2274. These conductive pathways may take the form of any of the interconnect structures comprising lines and/or vias.

Package substrate 2252 may include conductive contacts 2263 that are coupled to conductive pathway 2262 through package substrate 2252, allowing circuitry within dies 2256 and/or interposer 2257 to electrically couple to various ones of conductive contacts 2264 (or to other devices included in package substrate 2252, not shown).

IC package 2200 may include interposer 2257 coupled to package substrate 2252 via conductive contacts 2261 of interposer 2257, first-level interconnects 2265, and conductive contacts 2263 of package substrate 2252. First-level interconnects 2265 illustrated in the figure are solder bumps, but any suitable first-level interconnects 2265 may be used, such as solder bumps, solder posts, or bond wires.

IC package 2200 may include one or more dies 2256 coupled to interposer 2257 via conductive contacts 2254 of dies 2256, first-level interconnects 2258, and conductive contacts 2260 of interposer 2257. Conductive contacts 2260 may be coupled to conductive pathways (not shown) through interposer 2257, allowing circuitry within dies 2256 to electrically couple to various ones of conductive contacts 2261 (or to other devices included in interposer 2257, not shown). First-level interconnects 2258 illustrated in the figure are solder bumps, but any suitable first-level interconnects 2258 may be used, such as solder bumps, solder posts, or bond wires. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, underfill material 2266 may be disposed between package substrate 2252 and interposer 2257 around first-level interconnects 2265, and mold 2268 may be disposed around dies 2256 and interposer 2257 and in contact with package substrate 2252. In some embodiments, underfill material 2266 may be the same as mold 2268. Example materials that may be used for underfill material 2266 and mold 2268 are epoxies as suitable. Second-level interconnects 2270 may be coupled to conductive contacts 2264. Second-level interconnects 2270 illustrated in the figure are solder balls (e.g., for a ball grid array (BGA) arrangement), but any suitable second-level interconnects 2270 may be used (e.g., pins in a pin grid array arrangement or lands in a land grid array arrangement). Second-level interconnects 2270 may be used to couple IC package 2200 to another component, such as a circuit board (e.g., a motherboard), an interposer, or another IC package, as known in the art and as discussed below with reference to FIG. 14.

In various embodiments, any of dies 2256 may be microelectronic assembly 100 as described herein. In embodiments in which IC package 2200 includes multiple dies 2256, IC package 2200 may be referred to as a multi-chip package (MCP). Dies 2256 may include circuitry to perform any desired functionality. For example, besides one or more of dies 2256 being microelectronic assembly 100 as described herein, one or more of dies 2256 may be logic dies (e.g., silicon-based dies), one or more of dies 2256 may be memory dies (e.g., HBM), etc. In some embodiments, any of dies 2256 may be implemented as discussed with reference to any of the previous figures. In some embodiments, at least some of dies 2256 may not include implementations as described herein.

Although IC package 2200 illustrated in the figure is a flip-chip package, other package architectures may be used. For example, IC package 2200 may be a BGA package, such as an embedded wafer-level ball grid array (eWLB) package. In another example, IC package 2200 may be a wafer-level chip scale package (WLCSP) or a panel fan-out (FO) package. Although two dies 2256 are illustrated in IC package 2200, IC package 2200 may include any desired number of dies 2256. IC package 2200 may include additional passive components, such as surface-mount resistors, capacitors, and inductors disposed over first face 2272 or second face 2274 of package substrate 2252, or on either face of interposer 2257. More generally, IC package 2200 may include any other active or passive components known in the art.

In some embodiments, no interposer 2257 may be included in IC package 2200; instead, dies 2256 may be coupled directly to conductive contacts 2263 at first face 2272 by first-level interconnects 2265.

FIG. 14 is a cross-sectional side view of an IC device assembly 2300 that may include components having one or more microelectronic assembly 100 in accordance with any of the embodiments disclosed herein. IC device assembly 2300 includes a number of components disposed over a circuit board 2302 (which may be, e.g., a motherboard). IC device assembly 2300 includes components disposed over a first face 2340 of circuit board 2302 and an opposing second face 2342 of circuit board 2302; generally, components may be disposed over one or both faces 2340 and 2342. In particular, any suitable ones of the components of IC device assembly 2300 may include any of the one or more microelectronic assembly 100 in accordance with any of the embodiments disclosed herein; e.g., any of the IC packages discussed below with reference to IC device assembly 2300 may take the form of any of the embodiments of IC package 2200 discussed above with reference to FIG. 13.

In some embodiments, circuit board 2302 may be a PCB including multiple metal layers separated from one another by layers of insulator and interconnected by electrically conductive vias. Any one or more of the metal layers may be formed in a desired circuit pattern to route electrical signals (optionally in conjunction with other metal layers) between the components coupled to circuit board 2302. In other embodiments, circuit board 2302 may be a non-PCB package substrate.

As illustrated in the figure, in some embodiments, IC device assembly 2300 may include a package-on-interposer structure 2336 coupled to first face 2340 of circuit board 2302 by coupling components 2316. Coupling components 2316 may electrically and mechanically couple package-on-interposer structure 2336 to circuit board 2302, and may include solder balls (as shown), male and female portions of a socket, an adhesive, an underfill material, and/or any other suitable electrical and/or mechanical coupling structure.

Package-on-interposer structure 2336 may include IC package 2320 coupled to interposer 2304 by coupling components 2318. Coupling components 2318 may take any suitable form depending on desired functionalities, such as the forms discussed above with reference to coupling components 2316. In some embodiments, IC package 2320 may be or include IC package 2200, e.g., as described above with reference to FIG. 13. In some embodiments, IC package 2320 may include at least one microelectronic assembly 100 as described herein. Microelectronic assembly 100 is not specifically shown in the figure in order to not clutter the drawing.

Although a single IC package 2320 is shown in the figure, multiple IC packages may be coupled to interposer 2304; indeed, additional interposers may be coupled to interposer 2304. Interposer 2304 may provide an intervening package substrate used to bridge circuit board 2302 and IC package 2320. Generally, interposer 2304 may redistribute a connection to a wider pitch or reroute a connection to a different connection. For example, interposer 2304 may couple IC package 2320 to a BGA of coupling components 2316 for coupling to circuit board 2302.

In the embodiment illustrated in the figure, IC package 2320 and circuit board 2302 are attached to opposing sides of interposer 2304. In other embodiments, IC package 2320 and circuit board 2302 may be attached to a same side of interposer 2304. In some embodiments, three or more components may be interconnected by way of interposer 2304.

Interposer 2304 may be formed of an epoxy resin, a fiberglass-reinforced epoxy resin, a ceramic material, or a polymer material such as polyimide. In some implementations, interposer 2304 may be formed of alternate rigid or flexible materials that may include the same materials described above for use in a semiconductor substrate, such as silicon, germanium, and other group III-V and group IV materials. Interposer 2304 may include metal interconnects 2308 and vias 2310, including but not limited to TSVs 2306. Interposer 2304 may further include embedded devices 2314, including both passive and active devices. Such devices may include, but are not limited to, capacitors, decoupling capacitors, resistors, inductors, fuses, diodes, transformers, sensors, ESD devices, and memory devices. More complex devices such as RF devices, power amplifiers, power management devices, antennas, arrays, sensors, and microelectromechanical systems (MEMS) devices may also be formed on interposer 2304. Package-on-interposer structure 2336 may take the form of any of the package-on-interposer structures known in the art.

In some embodiments, IC device assembly 2300 may include an IC package 2324 coupled to first face 2340 of circuit board 2302 by coupling components 2322. Coupling components 2322 may take the form of any of the embodiments discussed above with reference to coupling components 2316, and IC package 2324 may take the form of any of the embodiments discussed above with reference to IC package 2320.

In some embodiments, IC device assembly 2300 may include a package-on-package structure 2334 coupled to second face 2342 of circuit board 2302 by coupling components 2328. Package-on-package structure 2334 may include an IC package 2326 and an IC package 2332 coupled together by coupling components 2330 such that IC package 2326 is disposed between circuit board 2302 and IC package 2332. Coupling components 2328 and 2330 may take the form of any of the embodiments of coupling components 2316 discussed above, and IC packages 2326 and/or 2332 may take the form of any of the embodiments of IC package 2320 discussed above. Package-on-package structure 2334 may be configured in accordance with any of the package-on-package structures known in the art.

FIG. 15 is a block diagram of an example computing device 2400 that may include one or more components having one or more IC packages in accordance with any of the embodiments disclosed herein. For example, any suitable ones of the components of computing device 2400 may include a microelectronic assembly (e.g., 100) in accordance with any of the embodiments disclosed herein. In another example, any one or more of the components of computing device 2400 may include any embodiments of IC package 2200 (e.g., as shown in FIG. 13). In yet another example, any one or more of the components of computing device 2400 may include an IC device assembly 2300 (e.g., as shown in FIG. 14).

A number of components are illustrated in the figure as included in computing device 2400, but any one or more of these components may be omitted or duplicated, as suitable for the application. In some embodiments, some or all of the components included in computing device 2400 may be attached to one or more motherboards. In some embodiments, some or all of these components are fabricated onto a single system-on-chip (SOC) die.

Additionally, in various embodiments, computing device 2400 may not include one or more of the components illustrated in the figure, but computing device 2400 may include interface circuitry for coupling to the one or more components. For example, computing device 2400 may not include a display device 2406, but may include display device interface circuitry (e.g., a connector and driver circuitry) to which display device 2406 may be coupled. In another set of examples, computing device 2400 may not include an audio input device 2418 or an audio output device 2408, but may include audio input or output device interface circuitry (e.g., connectors and supporting circuitry) to which audio input device 2418 or audio output device 2408 may be coupled.

Computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. Processing device 2402 may include one or more DSPs, ASICs, CPUs, GPUs, cryptoprocessors (specialized processors that execute cryptographic algorithms within hardware), server processors, or any other suitable processing devices. Computing device 2400 may include a memory 2404, which may itself include one or more memory devices such as volatile memory (e.g., DRAM), nonvolatile memory (e.g., read-only memory (ROM)), flash memory, solid-state memory, and/or a hard drive. In some embodiments, memory 2404 may include memory that shares a die with processing device 2402. This memory may be used as cache-memory and may include embedded-DRAM (eDRAM) or spin transfer torque magnetic random-access memory (STT-MRAM).

In some embodiments, computing device 2400 may include a communication chip 2412 (e.g., one or more communication chips). For example, communication chip 2412 may be configured for managing wireless communications for the transfer of data to and from computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), LTE project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 2412 may operate in accordance with other wireless protocols in other embodiments. Computing device 2400 may include an antenna 2422 to facilitate wireless communications and/or to receive other wireless communications (such as AM or FM radio transmissions).

In some embodiments, communication chip 2412 may manage wired communications, such as electrical, optical, or any other suitable communication protocols (e.g., the Ethernet). As noted above, communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

Computing device 2400 may include battery/power circuitry 2414. Battery/power circuitry 2414 may include one or more energy storage devices (e.g., batteries or capacitors) and/or circuitry for coupling components of computing device 2400 to an energy source separate from computing device 2400 (e.g., AC line power).

Computing device 2400 may include a display device 2406 (or corresponding interface circuitry, as discussed above). Display device 2406 may include any visual indicators, such as a heads-up display, a computer monitor, a projector, a touchscreen display, a liquid crystal display (LCD), a light-emitting diode display, or a flat panel display, for example.

Computing device 2400 may include audio output device 2408 (or corresponding interface circuitry, as discussed above). Audio output device 2408 may include any device that generates an audible indicator, such as speakers, headsets, or earbuds, for example.

Computing device 2400 may include audio input device 2418 (or corresponding interface circuitry, as discussed above). Audio input device 2418 may include any device that generates a signal representative of a sound, such as microphones, microphone arrays, or digital instruments (e.g., instruments having a musical instrument digital interface (MIDI) output).

Computing device 2400 may include a GPS device 2416 (or corresponding interface circuitry, as discussed above). GPS device 2416 may be in communication with a satellite-based system and may receive a location of computing device 2400, as known in the art.

Computing device 2400 may include other output device 2410 (or corresponding interface circuitry, as discussed above). Examples of other output device 2410 may include an audio codec, a video codec, a printer, a wired or wireless transmitter for providing information to other devices, or an additional storage device.

Computing device 2400 may include other input device 2420 (or corresponding interface circuitry, as discussed above). Examples of other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio-frequency identification (RFID) reader.

Computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, computing device 2400 may be any other electronic device that processes data.

Select Examples

The following paragraphs provide various examples of the embodiments disclosed herein.

Example 1 provides a microelectronic assembly (e.g., 100, FIGS. 1-7), comprising: a package substrate (e.g., 102); a first IC die (e.g., 104); a second IC die (e.g., 106) between the first IC die and the package substrate; a dielectric material (e.g., 114) at least between the first IC die and the package substrate; and a plurality of vias (e.g., 116) through the dielectric material, the vias coupling the first IC die and the package substrate, in which: the microelectronic assembly is in a space defined by three mutually orthogonal axes, namely a first axis (e.g., X-axis), a second axis (e.g., Y-axis), and a third axis (e.g., Z-axis), the package substrate, the first IC die and the second IC die are mutually parallel in first planes defined by the first axis and the third axis, the vias are in one or more second planes defined by the second axis and the third axis, and the vias are inclined at an angle (e.g., 118) not equal to ninety degrees (i.e., acute angle or obtuse angle) around the first axis.

Example 2 provides the microelectronic assembly of example 1 (e.g., FIG. 1), in which the first IC die is conductively coupled to the package substrate by at least one of: (1) a first conductive pathway (e.g., 124) through the plurality of vias, and (2) a second conductive pathway (e.g., 126) through the second IC die, the second conductive pathway comprising one or more TSVs (e.g., 128).

Example 3 provides the microelectronic assembly of any one of examples 1-2 (e.g., FIGS. 1-7), in which the second IC die comprises a stack of the second IC dies arranged in a plurality of layers (e.g., 108), adjacent layers being coupled by first-level interconnects (FLIs) (e.g., 110).

Example 4 provides the microelectronic assembly of example 3, in which (e.g., FIGS. 1, 6, 7): the vias in the plurality of vias are first vias (e.g., 116), the angle is a first angle, a particular second IC die in the stack is a third IC die (e.g., 106(1)), the third IC die in the stack is not adjacent to the first IC die (e.g., 104), the first IC die is coupled to the third IC die by a plurality of second vias (e.g., 120), the second vias are in the one or more second planes defined by the second axis and the third axis, and the second vias are inclined at second angles not equal to ninety degrees around the first axis.

Example 5 provides the microelectronic assembly of example 4, in which (e.g., FIG. 1): another IC die in the stack between the first IC die and the package substrate is a fourth IC die (e.g., 106(2)), and the first IC die is conductively coupled to the third IC die in the stack by at least one of: (1) a first conductive pathway (e.g., 130) through the plurality of second vias, and (2) a second conductive pathway (e.g., 126) through the fourth IC die, the second conductive pathway comprising one or more TSVs (e.g., 128).

Example 6 provides the microelectronic assembly of any one of examples 4-5, in which (e.g., FIGS. 6, 7): the first IC die comprises a plurality of digital logic circuits (e.g., 402); and the plurality of second vias couple at least a subset of the plurality of digital logic circuits with one or more of the second IC dies (e.g., 106(1)).

Example 7 provides the microelectronic assembly of any one of examples 4-6, in which (e.g., FIG. 7): another IC die in the stack between the first IC die and the package substrate is a fourth IC die (e.g., 106(3)), the fourth IC die not adjacent to the third IC die, the fourth IC die is coupled to the third IC die by one or more third vias (e.g., 702), the third vias are in the one or more second planes defined by the second axis and the third axis, and the third vias are inclined at third angle not equal to ninety degrees around the first axis.

Example 8 provides the microelectronic assembly of example 7, in which (e.g., FIG. 7): the plurality of digital logic circuits comprises a first plurality of digital circuits (e.g., 402(1)), the second IC die comprises a second plurality of digital logic circuits (e.g., 402(2)), the plurality of second vias couple a subset of the first plurality of digital logic circuits and a subset of the second plurality of digital logic circuits, and the plurality of third vias couple the fourth IC die to another subset of the second plurality of digital logic circuits.

Example 9 provides the microelectronic assembly of example 8, in which the first plurality of digital logic circuits consumes higher power during operation than the second plurality of digital logic circuits.

Example 10 provides the microelectronic assembly of example 9, in which a heat sink is coupled to the first IC die.

Example 11 provides the microelectronic assembly of example 3, in which (e.g., FIGS. 1, 4, 5): the vias in the plurality of vias are first vias, the angle is a first angle, one or more IC dies (e.g., 106(2), 106(3)) in the stack of second IC dies are third IC dies, the third IC dies are not adjacent to the package substrate, the third IC dies are coupled to the package substrate by a plurality of second vias (e.g., 122), the second vias are in the one or more second planes defined by the second axis and the third axis, and the second vias are inclined at second angles not equal to ninety degrees around the first axis.

Example 12 provides the microelectronic assembly of example 11, in which (e.g., FIG. 1): a particular one of the second IC die in the stack is a fourth IC die (e.g., 106(1)), and one or more third IC dies are conductively coupled to the package substrate by at least one of: (1) a first conductive pathway (e.g., 132) through the plurality of second vias, and (2) a second conductive pathway (e.g., 126) through the fourth IC die, the second conductive pathway comprising one or more TSVs (e.g., 128).

Example 13 provides the microelectronic assembly of any one of examples 11-12, in which (e.g., FIGS. 4, 5): a particular one of the second IC die in the stack is a fourth IC die (e.g., 106(1)), one of the third IC dies is between the first IC die and the fourth IC die, the first IC die overhangs beyond an edge of the one of the third IC dies by a first overhang region (e.g., 404), at least a subset of the plurality of first vias is in the first overhang region, the one of the third IC dies overhangs beyond an edge of the fourth IC die by a second overhang region (e.g., 406), and at least a subset of the plurality of second vias is in the second overhang region.

Example 14 provides the microelectronic assembly of example 13, in which (e.g., FIGS. 4, 5): the package substrate is coupled to a plurality of digital logic circuits (e.g., 402), the plurality of first vias couple the first IC die and a first subset of the plurality of digital logic circuits (e.g., 402(1)), and the plurality of second vias couple the one or more third IC dies and a second subset of the plurality of digital logic circuits (e.g., 402(2-4)).

Example 15 provides the microelectronic assembly of example 14, in which (e.g., FIG. 5): the second IC dies are conductively coupled to each other by wire-bonds (e.g., 502), and the first IC die is conductively coupled to one of the second IC dies by another wire-bond.

Example 16 provides the microelectronic assembly of example 1 (e.g., FIGS. 1-7), in which the first IC die and the second IC die each comprise: a substrate (e.g., 134); a metallization stack (e.g., 136); and an active region (e.g., 138) between the substrate and the metallization stack.

Example 17 provides the microelectronic assembly of example 16, in which the metallization stack of the first IC die is adjacent to and in contact with the metallization stack of the second IC die (e.g., front-to-front).

Example 18 provides the microelectronic assembly of example 16, in which the metallization stack of the first IC die is adjacent to and in contact with the substrate of the second IC die (e.g., front-to-back).

Example 19 provides the microelectronic assembly of example 16, in which the substrate of the first IC die is adjacent to and in contact with the substrate of the second IC die (e.g., back-to-back).

Example 20 provides the microelectronic assembly of example 16, in which the substrate of the first IC die is adjacent to and in contact with the metallization stack of the second IC die (e.g., back-to-front).

Example 21 provides the microelectronic assembly of any one of examples 1-20 (e.g., FIGS. 1-7), in which the vias in the plurality of vias are arranged in parallel rows, each row being in one of the second planes.

Example 22 provides the microelectronic assembly of example 21, in which vias in any one row are mutually parallel to each other.

Example 23 provides the microelectronic assembly of any one of examples 21-22 (e.g., FIGS. 2, 3), further comprising metal plates (e.g., 202) between any two adjacent rows.

Example 24 provides the microelectronic assembly of any one of examples 21-23 (e.g., FIG. 2A), in which at least some vias are approximately 90 degrees around the first axis.

Example 25 provides the microelectronic assembly of example 21 (e.g., FIG. 3B), in which at least some vias in any one row are not mutually parallel.

Example 26 provides the microelectronic assembly of any one of examples 1-25, in which the first IC die is coupled to the second IC die by FLIs (e.g., 110) and the second IC die is coupled to the package substrate by SLIs (e.g., 112).

Example 27 provides the microelectronic assembly of any one of examples 1-26, in which the dielectric material comprises an organic material selected from at least one of mold compound, underfill material, and polyimide.

Example 28 provides the microelectronic assembly of any one of examples 1-26, in which the dielectric material comprises air.

Example 29 provides the microelectronic assembly of any one of examples 1-28, in which: a portion of the first IC die or the second IC die comprises digital logic circuits, and another portion of the first IC die or the second IC die comprises memory circuits.

Example 30 provides an IC package (e.g., 100), comprising: a package substrate (e.g., 102); a first IC die (e.g., 106(1)) coupled to the package substrate; a second IC die (e.g., 106(2), 106(3)) on a side of the first IC die opposite to the package substrate; a third IC die (e.g., 104) coupled to the second IC die on a side of the second IC die opposite to the first IC die; a dielectric material (e.g., 114) surrounding at least the first IC die and the second IC die; and a via (e.g., 116) through the dielectric material, the via coupling the third IC die and the package substrate, in which: at least one surface each of the third IC die and the package substrate are mutually parallel, and the via is inclined at an angle (e.g., 118) not equal to ninety degrees with respect to the third IC die or the package substrate in a plane orthogonal to the at least one surface.

Example 31 provides the IC package of example 30 (e.g., FIGS. 2, 3), in which the via is a first via, and the IC package further comprises a second via (e.g., 116) through the dielectric material, in which: the second via couples the third IC die and the package substrate, and the second via is not parallel to the via.

Example 32 provides the IC package of example 31 (e.g., FIG. 3A), further comprising a metal plate (e.g., 202) adjacent to the first via and the second via, in which: the metal plate extends between the third IC die and the package substrate, and the metal plate is parallel to the first via and the second via.

Example 33 provides the IC package of example 30 (e.g., FIG. 3A), in which the via is a first via, and the IC package further comprises a second via through the dielectric material, in which: the second via couples the third IC die and the package substrate, and the second via is parallel to the first via.

Example 34 provides the IC package of example 33 (e.g., FIG. 2A), further comprising a metal plate adjacent to the first via and the second via, in which: the metal plate extends between the third IC die and the package substrate, and the metal plate is parallel to the first via and the second via.

Example 35 provides the IC package of example 30 (e.g., FIGS. 4, 5), in which: the via is a first via (e.g., 116), the angle is a first angle, the IC package further comprises a second via (e.g., 122) through the dielectric material, the second via couples the second IC die and the package substrate, the second IC die and the package substrate are substantially parallel to each other, and the second via is inclined at a second angle (e.g., 118) not equal to ninety degrees with respect to the third IC die or the package substrate in a plane orthogonal to the at least one surface.

Example 36 provides the IC package of example 35 (e.g., FIGS. 4, 5), further comprising a first digital logic circuit (e.g., 402(1)) and a second digital logic circuit (e.g., 402(2)).

Example 37 provides the IC package of example 36 (e.g., FIGS. 4, 5), in which: the first via couples the third IC die and the first digital logic circuit, the second via couples the second IC die and the second digital logic circuit.

Example 38 provides the IC package of example 36 (e.g., FIG. 5), in which the third IC die and the second IC die are coupled by wire-bonds (e.g., 502).

Example 39 provides the IC package of example 30 (e.g., FIGS. 6, 7), in which: the via is a first via (e.g., 116), the angle is a first angle, the IC package further comprises a second via (e.g., 120) through the dielectric material, the second via couples the third IC die and the first IC die, the third IC die and the first IC die are substantially parallel to each other, and the second via is inclined at a second angle (e.g., 118) not equal to ninety degrees with respect to the third IC die or the first IC die in a plane orthogonal to the at least one surface.

Example 40 provides the IC package of example 39 (e.g., FIGS. 6, 7), further comprising a plurality of digital logic circuits (e.g., 402(1)) in the third IC die.

Example 41 provides the IC package of example 40, in which (e.g., FIGS. 6, 7) the second via couples the plurality of digital logic circuits and the first IC die.

Example 42 provides the IC package of example 41 (e.g., FIG. 6), further comprising a plurality of the first IC dies, in which the second IC die is coupled to more than one first IC die.

Example 43 provides the IC package of example 42 (e.g., FIG. 6), in which the plurality of the first IC dies is contained within a periphery of a shadow of the third IC die.

Example 44 provides the IC package of example 40 (e.g., FIG. 7), further comprising: a fourth IC die (e.g., 106(2)) between the second IC die (e.g., 106(3)) and the first IC die (e.g., 106(1)); and a third via (e.g., 702) through the dielectric material, in which: the third via couples the second IC die and the first IC die, the first IC die and the second IC die are substantially parallel to each other, and the third via is inclined at a third angle (e.g., 118) not equal to ninety degrees with respect to the first IC die or the second IC die in a plane orthogonal to the at least one surface.

Example 45 provides the IC package of example 44 (e.g., FIG. 7), further comprising a fourth via (e.g., 120) coupling the third IC die and the fourth IC die, in which the third IC die and the fourth IC die are substantially parallel to each other, and the fourth via is inclined at a fourth angle (e.g., 118) not equal to ninety degrees with respect to the third IC die or the fourth IC die in a plane orthogonal to the at least one surface.

Example 46 provides the IC package of example 45 (e.g., FIG. 7), further comprising another plurality of digital logic circuits in the first IC die, in which: the second via couples the plurality of digital logic circuits and the another plurality of digital logic circuits, the third via couples the second IC die and the another plurality of digital logic circuits, and the fourth via couples the fourth IC die and the plurality of digital logic circuits.

Example 47 provides the IC package of example 46 (e.g., FIG. 7), in which the plurality of digital logic circuits consumes higher power than the another plurality of digital logic circuits.

Example 48 provides the IC package of any one of examples 30-47, in which: the first IC die is coupled to the package substrate with second-level interconnects, and the second IC die is coupled to the third IC die with first-level interconnects.

Example 49 provides the IC package of any one of examples 30-48, in which the dielectric material comprises at least one of: air, mold compound and underfill material.

Example 50 provides the IC package of any one of examples 30-49, in which the package substrate is a silicon interposer.

Example 51 provides a method for fabricating a microelectronic assembly (e.g., FIG. 12), comprising: providing a package substrate; attaching a stack of IC dies to the package substrate; coating the package substrate and the stack of IC dies with a photoresist; removing the photoresist at via locations corresponding to at least one of through-dielectric vias and metal plates between the through-dielectric vias; depositing metal in the via locations; removing the photoresist; attaching another IC die to the stack of IC dies such that a portion of the another IC die contacts the deposited metal; and dispensing dielectric material around the stack of IC dies and the another IC die.

Example 52 provides the method of example 51, in which removing the photoresist comprises using a laser to remove the photoresist.

Example 53 provides the method of example 52, in which using the laser comprises: moving the laser across the photoresist in a first direction in a first pass to form a row of vias having a first angle, the laser is moved orthogonally to the first direction by a distance corresponding to a spacing between adjacent rows of vias, and moving the laser across the photoresist in a second direction in a second pass to form another row of vias having a second angle, the second angle being opposite to the first angle.

Example 54 provides the method of example 51, in which coating with a photoresist and removing the photoresist are repeated multiple times with overlapping and adjacent via locations to create vias with a stepped, slanted profile (e.g., 1234).

Example 55 provides the method of any one of examples 51-54, in which depositing the metal comprises electroplating.

Example 56 provides the method of any one of examples 51-55, in which attaching the another IC die comprises forming first-level interconnects between the another IC die and the stack of IC dies.

Example 57 provides the method of any one of examples 51-56, in which attaching the stack of IC dies to the package substrate comprises forming second-level interconnects between the stack of IC dies and the package substrate.

Example 58 provides the method of any one of examples 51-57, further comprising repeating coating the photoresist, removing the photoresist, depositing metal, and attaching another IC die until a multi-layered stack of IC dies is formed according to a desired configuration, with the through-dielectric vias between any two non-adjacent IC dies, and between the package substrate and any IC die not adjacent to the package substrate.

Example 59 provides the method of any one of examples 51-58, further comprising curing the dielectric material.

Example 60 provides the method of any one of examples 51-59, in which at least some IC dies in the stack comprise memory circuits and the another IC die comprises digital logic circuits.

The above description of illustrated implementations of the disclosure, including what is described in the abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. A microelectronic assembly, comprising:
a package substrate;
a first integrated circuit (IC) die;
a second IC die between the first IC die and the package substrate;
a dielectric material at least between the first IC die and the package substrate; and
a plurality of vias through the dielectric material, the vias coupling the first IC die and the package substrate, wherein:
   the microelectronic assembly is in a space defined by three mutually orthogonal axes, namely a first axis, a second axis, and a third axis,
   the package substrate, the first IC die and the second IC die are mutually parallel in first planes defined by the first axis and the third axis,
   the vias are in one or more second planes defined by the second axis and the third axis, and
   the vias are inclined at an angle not equal to ninety degrees around the first axis.

2. The microelectronic assembly of claim 1, wherein the second IC die comprises a stack of the second IC dies arranged in a plurality of layers, adjacent layers being coupled by first-level interconnects (FLIs).

3. The microelectronic assembly of claim 2, wherein:
the vias in the plurality of vias are first vias,
a particular second IC die in the stack is a third IC die,
the third IC die in the stack is not adjacent to the first IC die,
the first IC die is coupled to the third IC die by a plurality of second vias, the second vias are in the one or more second planes defined by the second axis and the third axis, and
the second vias are inclined at angles not equal to ninety degrees around the first axis.

4. The microelectronic assembly of claim 3, wherein:
the first IC die comprises a plurality of digital logic circuits; and
the plurality of second vias couple at least a subset of the plurality of digital logic circuits with one or more of the second IC dies.

5. The microelectronic assembly of claim 3, wherein:
another IC die in the stack between the first IC die and the package substrate is a fourth IC die,
the fourth IC die not adjacent to the third IC die,
the fourth IC die is coupled to the third IC die by one or more third vias,
the third vias are in the one or more second planes defined by the second axis and the third axis, and
the third vias are inclined at angles not equal to ninety degrees around the first axis.

6. The microelectronic assembly of claim 2, wherein:
the vias in the plurality of vias are first vias,
one or more IC dies in the stack of second IC dies are third IC dies,
the third IC dies are not adjacent to the package substrate,
the third IC dies are coupled to the package substrate by a plurality of second vias,
the second vias are in the one or more second planes defined by the second axis and the third axis, and
the second vias are inclined at angles not equal to ninety degrees around the first axis.

7. The microelectronic assembly of claim 6, wherein:
a particular one of the second IC die in the stack is a fourth IC die,
one of the third IC dies is between the first IC die and the fourth IC die,
the first IC die overhangs beyond an edge of the one of the third IC dies by a first overhang region,
at least a subset of the plurality of first vias is in the first overhang region,
the one of the third IC dies overhangs beyond an edge of the fourth IC die by a second overhang region, and
at least a subset of the plurality of second vias is in the second overhang region.

8. The microelectronic assembly of claim 1, wherein the vias in the plurality of vias are arranged in parallel rows, each row being in one of the second planes, and the microelectronic assembly further comprises metal plates between any two adjacent rows.

9. The microelectronic assembly of claim 1, wherein the dielectric material comprises an organic material selected from at least one of mold compound, underfill material, and polyimide.

10. An IC package, comprising:
a package substrate;
a first IC die coupled to the package substrate;
a second IC die on a side of the first IC die opposite to the package substrate;
a third IC die coupled to the second IC die on a side of the second IC die opposite to the first IC die;
a dielectric material surrounding at least the first IC die and the second IC die; and
a via through the dielectric material, the via coupling the third IC die and the package substrate, wherein:
   at least one surface each of the third IC die and the package substrate are mutually parallel, and the via is inclined at an angle not equal to ninety degrees with respect to the third IC die or the package substrate in a plane orthogonal to the at least one surface.

11. The IC package of claim 10, wherein the via is a first via, and the IC package further comprises a second via through the dielectric material, wherein:

the second via couples the third IC die and the package substrate, and the second via is not parallel to the first via.

12. The IC package of claim 11, further comprising a metal plate adjacent to the first via and the second via, wherein:

the metal plate extends between the third IC die and the package substrate, and the metal plate is parallel to the first via and the second via.

13. The IC package of claim 10, wherein:

the via is a first via, the IC package further comprises a second via through the dielectric material, the second via couples the second IC die and the package substrate, the second IC die and the package substrate are substantially parallel to each other, and the second via is inclined at angles not equal to ninety degrees with respect to the third IC die or the package substrate in a plane orthogonal to the at least one surface.

14. The IC package of claim 13, further comprising a first digital logic circuit and a second digital logic circuit, wherein the third IC die and the second IC die are coupled by wire-bonds.

15. The IC package of claim 10, wherein:

the via is a first via, the IC package further comprises a second via through the dielectric material, the second via couples the third IC die and the first IC die, the third IC die and the first IC die are substantially parallel to each other, and the second via is inclined at angles not equal to ninety degrees with respect to the third IC die or the first IC die in a plane orthogonal to the at least one surface.

16. The IC package of claim 15, further comprising:

a plurality of digital logic circuits in the third IC die;

a fourth IC die between the second IC die and the first IC die; and a third via through the dielectric material, wherein:

the third via couples the second IC die and the first IC die, the first IC die and the second IC die are substantially parallel to each other, and the third via is inclined at angles not equal to ninety degrees with respect to the first IC die or the second IC die in a plane orthogonal to the at least one surface.

17. The IC package of claim 10, wherein the dielectric material comprises at least one of: mold compound and underfill material.

18. The microelectronic assembly of claim 1, wherein the first IC die and the second IC die each comprise a substrate, a metallization stack, and an active region between the substrate and the metallization stack.

19. The microelectronic assembly of claim 18, wherein the metallization stack of the first IC die is adjacent to and in contact with one of the substrate of the first IC and the metallization stack of the second IC.

20. The microelectronic assembly of claim 8, wherein vias in any one row are mutually parallel to each other.

* * * * *